United States Patent
Martel et al.

(10) Patent No.: US 6,849,491 B2
(45) Date of Patent: Feb. 1, 2005

(54) METHOD OF MAKING HIGH-VOLTAGE BIPOLAR/CMOS/DMOS (BCD) DEVICES

(75) Inventors: Stephane Martel, Granby (CA); Yan Riopel, Bromont (CA); Sebastien Michel, Bromont (CA); Luc Ouellet, Granby (CA)

(73) Assignee: DALSA Semiconductor Inc., Waterloo (CA)

( * ) Notice: Subject to any disclaimer, the term of this patent is extended or adjusted under 35 U.S.C. 154(b) by 0 days.

(21) Appl. No.: 09/964,472

(22) Filed: Sep. 28, 2001

(65) Prior Publication Data

US 2003/0068844 A1 Apr. 10, 2003

(51) Int. Cl.[7] ........................ H01L 21/00; H01L 21/84; H01L 21/8238
(52) U.S. Cl. ........................ 438/202; 438/154; 438/206
(58) Field of Search .................. 438/154, 202, 438/206

(56) References Cited

U.S. PATENT DOCUMENTS

| | | | |
|---|---|---|---|
| 4,795,716 A | 1/1989 | Yilmaz et al. | 437/27 |
| 5,429,959 A * | 7/1995 | Smayling | 438/234 |
| 5,541,125 A * | 7/1996 | Williams et al. | 438/202 |
| 5,578,506 A | 11/1996 | Lin | 437/21 |
| 5,681,761 A | 10/1997 | Kim | 437/21 |
| 5,854,113 A | 12/1998 | Kang et al. | 438/294 |
| 5,939,755 A | 8/1999 | Takeuchi et al. | 257/347 |
| 6,022,778 A * | 2/2000 | Contiero et al. | 438/268 |
| 6,111,297 A | 8/2000 | Grimaldi et al. | 257/401 |
| 6,130,458 A | 10/2000 | Takagi et al. | 257/351 |

OTHER PUBLICATIONS

"A–BCD: an economic 100V RESURF silicon–on–insulator BCD technology for consumer and automotive applications", Jacob A. van der Pol, et al.

* cited by examiner

Primary Examiner—Alexander Ghyka
(74) Attorney, Agent, or Firm—Marks & Clerk

(57) ABSTRACT

A process for making a integrated circuits of different typed is described wherein sequence of mask steps is applied to a substrate or epitaxial layer of p-type material. The sequence is chosen from a predefined common set of mask steps according to the particular type of integrated circuit to be fabricated. In this way, various types of integrated circuit can be fabricated in a most efficient manner.

11 Claims, 43 Drawing Sheets

Figure 1

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 5: VTP Adjust | Oxide Etch |
| | Oxidation (Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 3

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| | |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 4

| Name of Photolithography (Mask) | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type implant (N-Field) |
| | Oxidation (Field Oxide) |
| | Nitride Etch |
| | Oxide Etch |
| | Oxidation (Pre-Gate Oxide) |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 5

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Suboxide) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 5: Thin Gate Oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 6

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 9: Fuse | |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 7

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Submitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| ... | ... |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 8

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitex) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 9

| Number of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and BOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 11

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 4: ... | ... |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 12

| Name of Photolithography Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 13

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 4: ... | ... |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 7-9: ... | ... |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | BG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 14

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 4: Thick Gate Oxide & VTN Adjust | |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 7-9: N-LDD and P-LDD with Spacer Oxide | |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 15

| Names of Photolithographic Masks | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 16

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 4: Thick Gate Oxide | |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 7, 8, 9: LDD Implants and Sidewall Spacer | |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | BQ/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 17

| Name of Photolithographic Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 4: [Buried Contact / Depletion Implant] | |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Masks 7, 8, 9: [LDD / Spacer steps] | |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 18

| Name of Photolithography Mask | Process Steps |
|---|---|
| Mask 1: N-Well | Starting Material : P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Substrate) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 4: | |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/BOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide / Nitride Deposition |
| Mask 16: Passivation | Photo |
| | Oxide Etch |

Figure 42

| Active Component | Maximum Gate Voltage (V) | Maximum Drain Voltage (V) |
|---|---|---|
| The standard N-MOSFET of Figure 19a | 15 | 5.5 |
| The standard N-MOSFET of Figure 19b | 40 | 5.5 |
| The standard P-MOSFET of Figure 20a | 15 | 5.5 |
| The standard P-MOSFET of Figure 20b | 40 | 5.5 |
| The standard Junction isolated N-MOSFET of Figure 21a | 15 | 5.5 |
| The standard Junction isolated N-MOSFET of Figure 21b | 40 | 5.5 |
| The mid-voltage single extended N-MOSFET of Figure 22a | 15 | 40 |
| The mid-voltage single extended N-MOSFET of Figure 22b | 40 | 40 |
| The mid-voltage single extended P-MOSFET of Figure 23a | 15 | 40 |
| The mid-voltage single extended P-MOSFET of Figure 23b | 40 | 40 |
| The mid-voltage double extended N-MOSFET of Figure 24a | 15 | 40 |
| The mid-voltage double extended N-MOSFET of Figure 24b | 40 | 40 |
| The mid-voltage double extended P-MOSFET of Figure 25a | 15 | 40 |
| The mid-voltage double extended P-MOSFET of Figure 25b | 40 | 40 |
| The mid-voltage single extended N-LDMOSFET of Figure 26a | 15 | 75 |
| The mid-voltage single extended N-LDMOSFET of Figure 26b | 40 | 75 |
| The mid-voltage floating source N-LDMOSFET of Figure 27a | 15 | 75 |
| The mid-voltage floating source N-LDMOSFET of Figure 27b | 40 | 75 |
| The high-voltage single extended N-MOSFET of Figure 28a | 15 | 100 |
| The high-voltage single extended N-MOSFET of Figure 28b | 40 | 100 |
| The high-voltage single extended P-MOSFET of Figure 29a | 15 | 100 |
| The high-voltage single extended P-MOSFET of Figure 29b | 40 | 100 |
| The high-voltage double extended N-MOSFET of Figure 30a | 15 | 100 |
| The high-voltage double extended N-MOSFET of Figure 30b | 40 | 100 |
| The high-voltage double extended P-MOSFET of Figure 31a | 15 | 100 |
| The high-voltage double extended P-MOSFET of Figure 31b | 40 | 100 |
| The high-voltage double extended N-LDMOSFET of Figure 32a | 15 | 325 |
| The high-voltage double extended N-LDMOSFET of Figure 32b | 40 | 325 |
| The very-high-voltage single extended N-LDMOSFET of Figure 33a | 15 | 600 |
| The very-high-voltage single extended N-LDMOSFET of Figure 33b | 40 | 600 |
| The very-high-voltage single extended P-MOSFET of Figure 34a | 15 | 325 |
| The very-high-voltage single extended P-MOSFET of Figure 34b | 40 | 325 |
| The very-high-voltage double extended P-MOSFET of Figure 35a | 15 | 325 |

| | | |
|---|---|---|
| The very-high-voltage double extended P-MOSFET of Figure 35b 325 | 40 | |
| The lateral NPN bipolar transistor of Figure 36 | - | 15 |
| The high-voltage vertical NPN bipolar transistor of Figure 37 | - | 40 |
| The high-voltage vertical PNP bipolar transistor of Figure 38 | - | 55 |
| The very-high-gain vertical NPN bipolar transistor of Figure 39 3.3 | - | |
| The high-voltage N-JFET of Figure 40 | 600 | 600 |
| The very high-voltage LIGBT of Figure 41a | 15 | 600 |
| The very high-voltage LIGBT of Figure 41b | 40 | 600 |

Figure 43

| Junction | Typical Sheet Resistance | Typical Breakdown Voltage |
|---|---|---|
| P+ / N-Well | 65 Ohms/sq. | 20 Volts |
| N+ / P-Substrate | 50 Ohms/sq. | 25 Volts |
| P-Top / N-Well | 1d kOhms/sq. | 40 Volts |
| P-Base / N-Well | 1.75 kOhms/sq. | 45 Volts |
| N-Ext. / P-Substrate | 4 kOhms/sq. | 45 Volts |
| N-Well / P-Substrate | 1.5 kOhms/sq. | 150 Volts |
| N-Well / P-Top / P-Substrate (RESURF) | — | 650 Volts |

METHOD OF MAKING HIGH-VOLTAGE BIPOLAR/CMOS/DMOS (BCD) DEVICES

BACKGROUND OF THE INVENTION

1. Field of the Invention

This invention relates to the field of integrated circuit fabrication, and in particular to a method of making high-voltage bipolar/CMOS/DMOS (BCD) devices.

2. Description of Related Art

Bipolar/CMOS/DMOS (BCD) devices are employed in high voltage applications. They typically use a Silicon On Insulator (SOI) substrate or a complex epitaxial substrate combining at least two layers of two different types of dopant, N-Type and P-Type and a very complex sequence of masks to produce the required transistors and other active components. They only provide a partial combination of standard and high-voltage transistors for the designers, require process modifications, which can be major, to fulfill various voltage operation ranges.

The following three references describe Bipolar/CMOS/DMOS (BCD) processes which require the use of a substrate combining two or more layers of different dopant types which may or may not be buried under the silicon surface: C. Contiero, P. Galbiati, M. Palmieri, L. Vecchi, "LDMOS Implemetation by Large Tilt Implant in 0.6 µm BCD5 Process, Flash Memory Compatible", International Symposium on Power Semiconductor Devices and ICs (ISPSD), 1996, pp. 75–78; U.S. Pat. No. 6,111,297 "MOS-technology power device integrated structure . . . "; and U.S. Pat. No. 4,795,716 "Method of making a power IC structure with enhancement . . . "

This BCD approach requies extra masks and processing steps for lateral isolation as well as an expensive epitaxial deposition reactor used to generate buried epitaxial layers. A major disadvantage of this approach resides in the fact that the resulting DMOS transistors are mostly vertical.

The following five references describe other Bipolar/CMOS/DMOS (BCD) processes which require the use of a Silicon-On-Insulator (SOI) substrate to integrate the high-voltage components on a oxide dielectric layer buried under the silicon surface: J. A. van der Pol, "A-BCD: An Economic 100V RESURF Silicon-On-Insulator BCD Technology for Consumer and Automotive Applications", International Symposium on Power Semiconductor Devices and ICs (ISPSD), 2000, pp. 327–330; U.S. Pat. No. 6,130,458 "Power IC having SOI structure"; U.S. Pat. No. 5,939,755 "Power IC having high-side and low-side switches in an SOI . . . "; U.S. Pat. No. 5,854,113 "Method for fabricating power transistor using . . . "; U.S. Pat. No. 5,681,761 "Microwave power SOI-MOSFET with high conductivity . . . "; and U.S. Pat. No. 5,578,506 "Method of fabricating improved lateral Silicon-On-Insulator . . . "

These BCD processes on SOI wafers using very expensive SOI substrates also add costs and additional processing steps for lateral isolation. More importantly, the high-voltage components built on SOI substrates cannot be integrated on the bulk or epitaxial wafer of our invention because some components would not be self-isolated from other components and would share common drain electrodes.

These and other Prior Art BCD processes that can be found in the literature cannot integrate high-voltage single extended NMOSFET or high-voltage double extended NMOSFET distinct from the DMOS transistor simply because these processes do not provide an isolated N-Well in a P-Type region, thus forming the required isolating junction. The resulting number of high-voltage N-Channel components is therefore reduced compared to our proposed invention.

SUMMARY OF THE INVENTION

According to the present invention there is provided a process for making an integrated circuit, comprising:

a) providing a substrate or epitaxial layer of p-type material; and b) applying a sequence of mask steps as follows:

(1) applying a first mask and forming at least one N-well in said p-type material therethrough;

(2) applying a second mask and forming an active region therethrough;

(3) applying a third mask and forming a p-type field region therethrough;

(4) applying a fourth mask and forming a gate oxide therethrough;

(5) applying a fifth mask and carrying out a p-type implantation therethrough;

(6) applying a sixth mask and forming polysilicon gate regions therethrough;

(7) applying a seventh mask and forming a p-base region therethrough;

(8) applying an eighth mask and forming a N-extended region therethrough;

(9) applying a ninth mask and forming a p-top region therethrough;

(10) applying a tenth mask and carrying out an N+ implant therethrough;

(11) applying an eleventh mask and carrying out a P+ implant therethrough;

(12) applying a twelfth mask and forming contacts therethrough;

(13) applying a thirteenth mask and depositing a metal layer therethrough;

(14) applying a fourteenth mask and forming vias therethrough;

(15) applying a fifteenth mask and depositing a metal layer therethrough; and

(16) applying a sixteenth mask and forming a passivation layer therethrough; and wherein up to any three of mask steps 4, 7, 8, and 9 may be omitted depending on the type of integrated circuit.

The invention provides a lower fabrication cost and more simple Bipolar/CMOS/DMOS (BCD) process which uses a simpler and lower cost single P-Type dopant substrate; P-Type bulk substrate or; P-Epitaxial on P+ Bulk substrate (for improved latch-up immunity); a simpler and lower cost 16-mask sequence to produce the required layers required to produce the various transistors and other active components; allows the designer to fulfill all voltage requirements between 3.3 and 600V by simply modifying the layout of the active component of interest without having to modify the process; and provides a complete combination of forty-one (41) standard and high-voltage active components ranging from 3.3 to 600 volts on this simpler and lower cost bulk or epitaxial P-type substrate of a single P-Type dopant.

These include six standard MOS transistors of both conductivity types, using two different gate oxide thicknesses, namely a standard N-MOSFET with standard gate oxide, a standard N-MOSFET with high-voltage gate oxide, a standard P-MOSFET with standard gate oxide, one standard P-MOSFET with high-voltage gate oxide; a standard Junction isolated N-MOSFET with standard gate oxide, a standard Junction isolated N-MOSFET with high-voltage gate oxide; twelve mid-voltage MOS transistors of both conductivity types, using two different gate oxide thicknesses, namely a mid-voltage single extended N-MOSFET with standard gate oxide, a mid-voltage single extended N-MOSFET with high-voltage gate oxide, a mid-voltage single extended P-MOSFET with standard gate oxide, a mid-voltage single extended P-MOSFET with high-voltage gate oxide, a mid-voltage double extended N-MOSFET with standard gate oxide, a mid-voltage double extended N-MOSFET with high-voltage gate oxide, a mid-voltage double extended P-MOSFET with standard gate oxide, a mid-voltage double extended P-MOSFET with high-voltage gate oxide, a mid-voltage single extended N-LDMOSFET with standard gate oxide, a mid-voltage single extended N-LDMOSFET with high-voltage gate oxide, a mid-voltage floating source N-LDMOSFET with standard gate oxide, a mid-voltage floating source N-LDMOSFET with high-voltage gate oxide; ten high-voltage MOS transistors of both conductivity types, using two different gate oxide thicknesses, namely a high-voltage single extended N-MOSFET with standard gate oxide, a high-voltage single extended N-MOSFET with high-voltage gate oxide, a high-voltage single extended P-MOSFET with standard gate oxide, a high-voltage single extended P-MOSFET with high-voltage gate oxide, a high-voltage double extended N-MOSFET with standard gate oxide, a high-voltage double extended N-MOSFET with high-voltage gate oxide, a high-voltage double extended P-MOSFET with standard gate oxide, a high-voltage double extended P-MOSFET with high-voltage gate oxide, a high-voltage double extended N-LDMOSFET with standard gate oxide, a high-voltage double extended N-LDMOSFET with high-voltage gate oxide; six very-high-voltage MOS transistors of both conductivity types, using two different gate oxide thicknesses, namely a very-high-voltage single extended N-LDMOSFET with standard gate oxide, a very-high-voltage single extended N-LDMOSFET with high-voltage gate oxide, a very-high-voltage single extended P-MOSFET with standard gate oxide, a very-high-voltage single extended P-MOSFET with high-voltage gate oxide, a very-high-voltage double extended P-MOSFET with standard gate oxide, a very-high-voltage double extended P-MOSFET with high-voltage gate oxide; one lateral NPN bipolar transistor; two high-voltage vertical bipolar transistors of complementary types, namely a high-voltage vertical NPN bipolar transistor, a high-voltage vertical PNP bipolar transistor, a very-high-gain vertical NPN bipolar transistor, a high-voltage N-JFET; a very-high-voltage Lateral Insulated Gate Bipolar transistor LIGBT, using two different gate oxide thicknesses, namely a very-high-voltage Lateral Insulated Gate Bipolar transistor LIGBT with standard gate oxide, and a very-high-voltage Lateral Insulated Gate Bipolar transistor LIGBT with high-voltage gate oxide.

Each additional mask step adds expense to a manufacturing procedure. It is indeed remarkable and highly advantageous that all these devices can be fabricated using a basic 16-mask sequence.

BRIEF DESCRIPTION OF THE DRAWINGS

The invention will now be described in more detail, by way of example only, with reference to the accompanying drawings, in which:

FIG. 1 lists a basic twelve-mask CMOS process with standard gate oxide;

FIG. 3 lists an N-Extended thirteen-mask CMOS process with standard gate oxide;

FIG. 4 lists a P-Top thirteen-mask Bipolar/CMOS process with standard gate oxide;

FIG. 5 lists a N-Extended and P-Top fourteen-mask Bipolar/CMOS process with standard gate oxide;

FIG. 6 lists a P-Base thirteen-mask Bipolar/CMOS/DMOS process with standard gate oxide;

FIG. 7 lists a P-Base and N-Extended fourteen-mask Bipolar/CMOS/DMOS process with standard gate oxide;

FIG. 8 lists a P-Base and P-Top fourteen-mask Bipolar/CMOS/DMOS process with standard gate oxide;

FIG. 9 lists a P-Base, N-Extended and P-Top fifteen-mask Bipolar/CMOS/DMOS process steps with standard gate oxide;

FIG. 11 lists a dual gate oxide basic thirteen-mask CMOS process;

FIG. 12 lists a dual gate oxide P-Top fourteen-mask Bipolar/CMOS process;

FIG. 13 lists the dual gate oxide N-Extended fourteen-mask CMOS process;

FIG. 14 lists a dual gate oxide N-Extended and P-Top fifteen-mask Bipolar/CMOS process;

FIG. 15 lists a dual gate oxide P-Base fourteen-mask Bipolar/CMOS/DMOS process;

FIG. 16 lists a dual gate oxide P-Base and N-Extended fifteen-mask Bipolar/CMOS/DMOS process;

FIG. 17 lists the dual gate oxide P-Base and P-Top fifteen-mask Bipolar/CMOS/DMOS process steps;

FIG. 18 lists a dual gate oxide P-Base, N-Extended and P-Top sixteen-mask Bipolar/CMOS/DMOS process;

FIG. 42 lists the operating voltage range of the 45 active components; and

FIG. 43 shows the various junctions characteristics of the various junctions.

DETAILED DESCRIPTION OF THE PREFERRED EMBODIMENTS

The invention is based on the use of a sixteen mask sequence as shown in the following table.

TABLE

| Name of Photolithographic Mask | Process Steps |
|---|---|
| Mask 1: N-Well | Starting Material: P- Bulk Silicon |
| | Oxidation (Initial oxide) |
| | Photo |
| | N-Type Implant (N-Well) |
| | Diffusion |
| Mask 2: Active Area | Oxide Etch |
| | Oxidation (Subnitox) |
| | Silicon Nitride Deposition (CVD) |
| | Photo |
| | Nitride Etch |
| Mask 3: P-Field | Photo |
| | P-Type Implant (P-Field) |
| | Blanket N-Type Implant (N-Field) |
| | Oxidation (Field Oxide) |
| | Nitride Etch |
| | Oxide Etch |
| | Oxidation (Pre-Gate Oxide) |
| Mask 4: High-voltage Gate Oxide | Oxide Etch |
| | Oxidation (High-voltage Gate Oxide) |
| | Photo |
| Mask 5: Thin Gate oxide & VTP Adjust | Oxide Etch |
| | Oxidation (Thin Gate Oxide) |
| | Photo |
| | P-Type Implant (VTP Adjust) |
| Mask 6: Polysilicon Gate Patterning | Polysilicon Gate Deposition (CVD) |
| | Polysilicon Doping |
| | Photo |
| | Polysilicon Etch |
| Mask 7: P-Base | Photo |
| | P-Type Implant (P-Base) |
| Mask 8: N-Extended | Photo |
| | N-Type Implant (N-Extended) |
| Mask 9: P-Top | Photo |
| | P-Type Implant (P-Top) |
| Mask 10: N+ Implant | Oxidation and Diffusion |
| | Polysilicon Oxidation |
| | Photo |
| | N-Type Implant (N+) |
| Mask 11: P+ Implant | Photo |
| | P-Type Implant (P+) |
| Mask 12: Contacts | SG/PSG/SOG (Oxide) Deposition |
| | Diffusion |
| | Photo |
| | Contact Etch |
| Mask 13: Metal 1 | Ti/TiN Deposition with Oxidation |
| | Aluminium Alloy Deposition |
| | Photo |
| | Metal Etch |
| | Dielectric and SOG (Oxide) Deposition |
| Mask 14: Vias | Photo |
| | Vias Etch |
| Mask 15: Metal 2 | Ti/TiN Deposition with Oxidation |
| | Aluminium Alloy Deposition |
| | Photo |
| | Metal Etch |
| | Oxide/Nitride Deposition |
| Mask 16: Passivation | Photo |
| | Oxide Etch |

Each mask step is associated with the sub-processes identified in the table. For example, in step 1, starting from bulk P-type silicon, an initial oxidation takes place followed by photolithography to define the mask. An N-type implant takes place to form the N-well, followed by a diffusion step. The sub-processes associated with each remaining step are set forth in the table.

Figure 2:
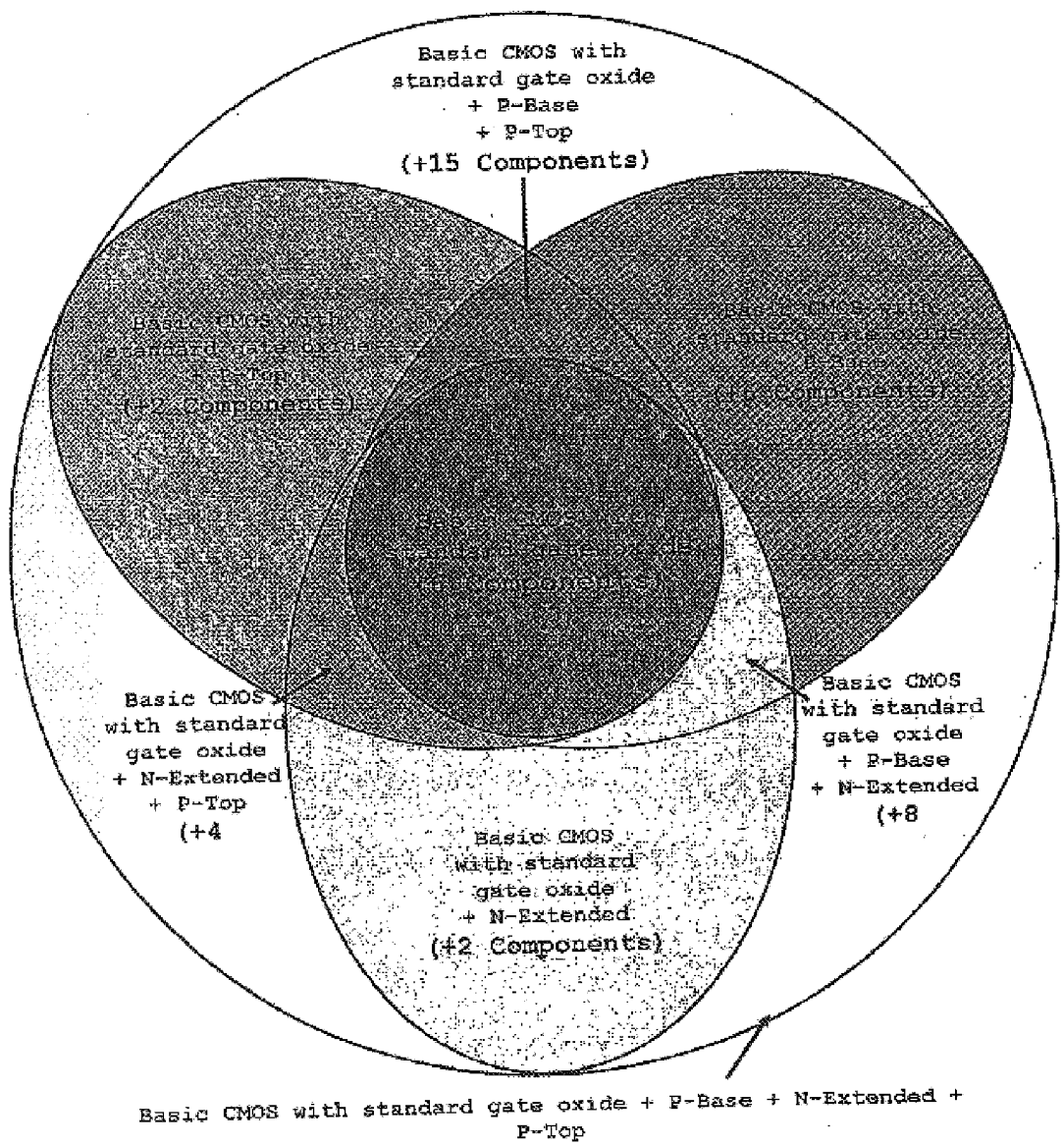
FIG. 2 shows the number of active components associated with the various combinations of masks of standard gate oxide processes.
Figure 19A:
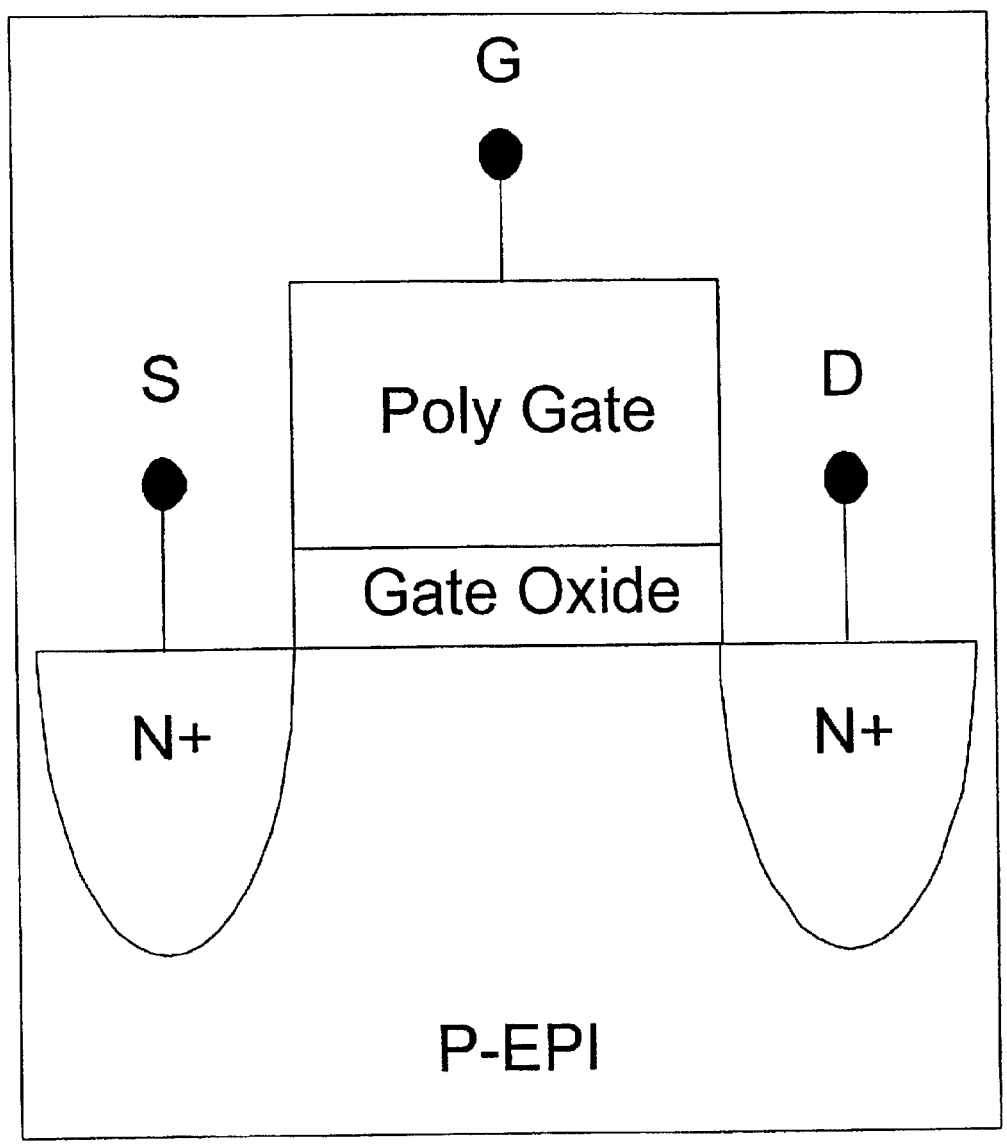
FIG. 19a illustrates a standard N-MOSFET with standard gate oxide.
Figure 20A:
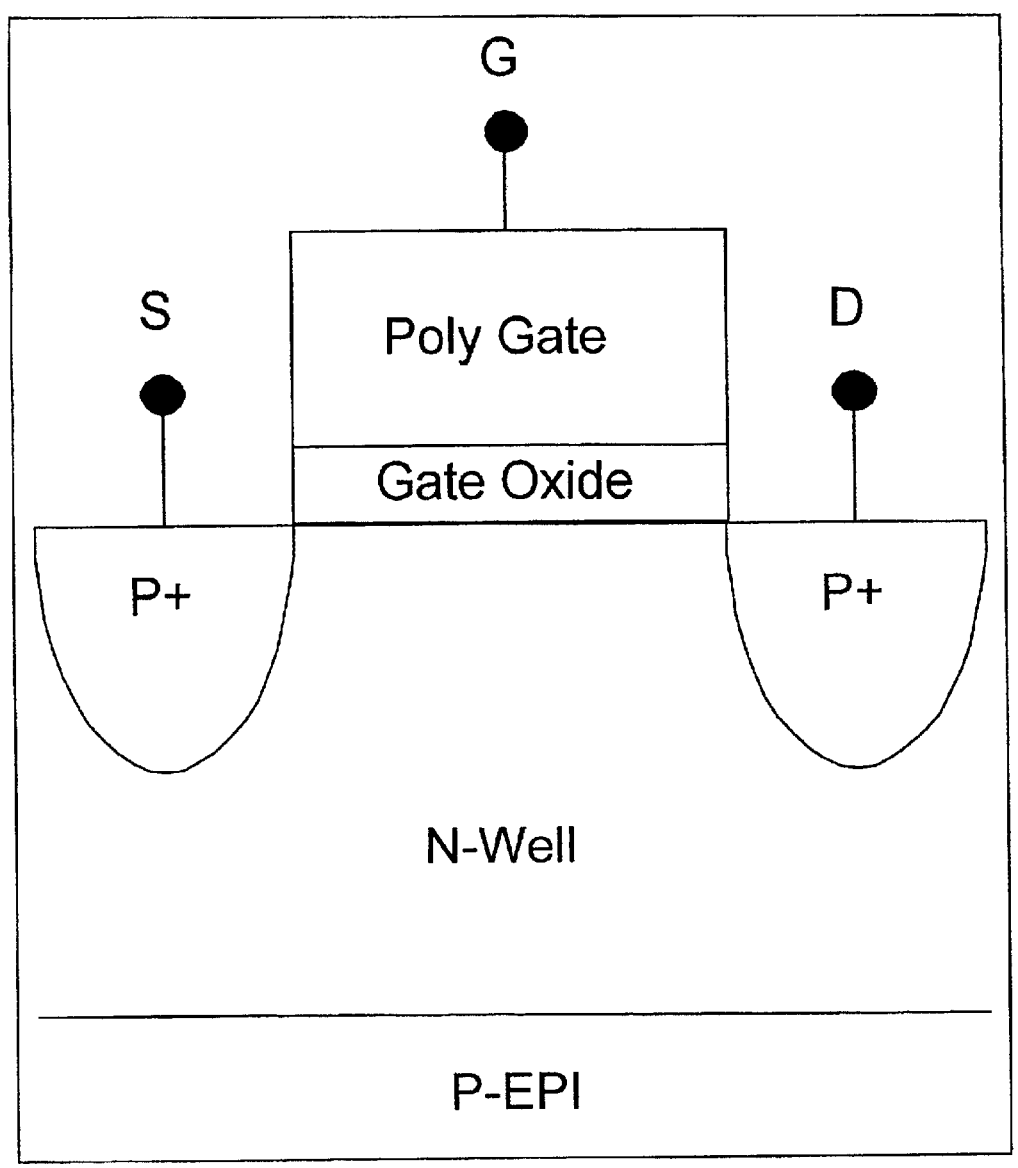
FIG. 20a illustrates a standard P-MOSFET with standard gate oxide.
Figure 22A:
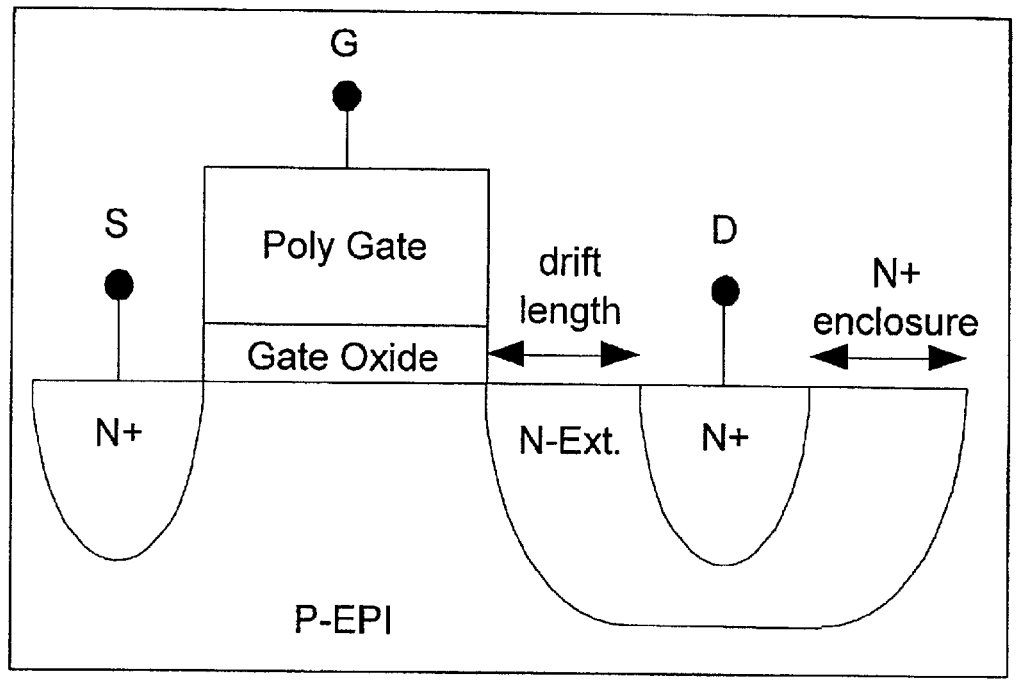
FIG. 22a illustrates a mid-voltage single extended N-MOSFET with standard gate oxide.
Figure 24A:
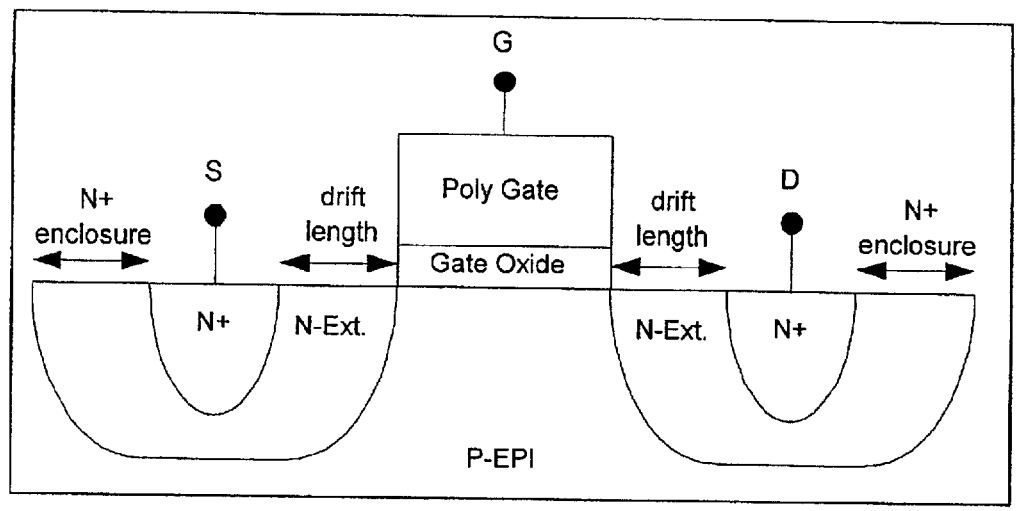
FIG. 24a illustrates a mid-voltage double extended N-MOSFET with standard gate oxide.
Figure 28A:
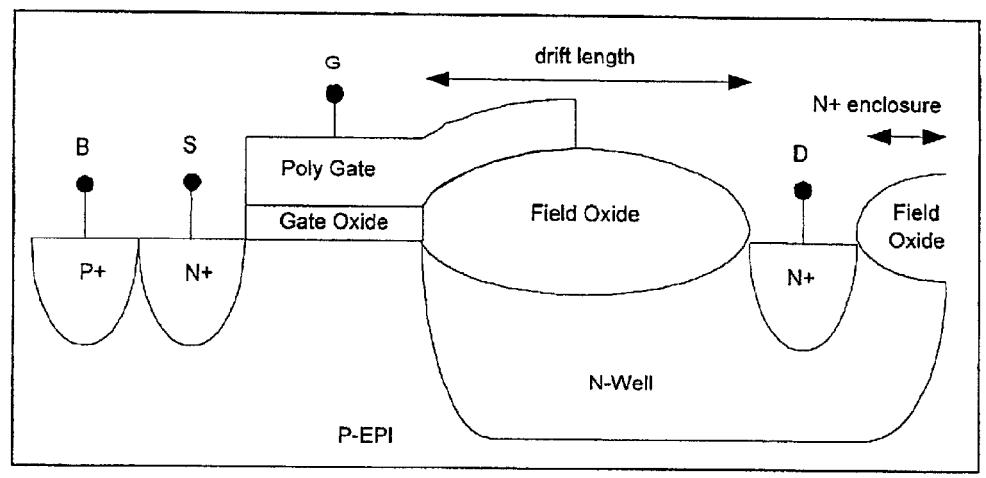
FIG. 28a illustrates a high-voltage single extended N-MOSFET with standard gate oxide.
Figure 30A:
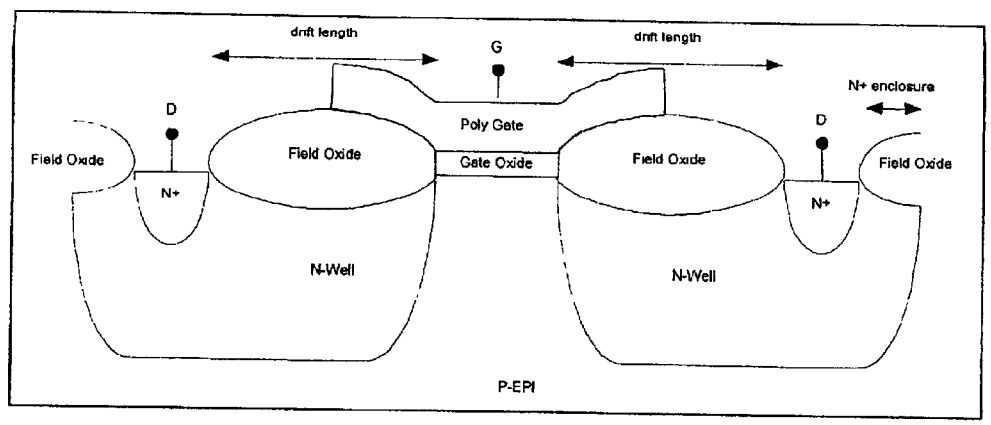
FIG. 30a illustrates a high-voltage double extended N-MOSFET with standard gate oxide.
Figure 36:
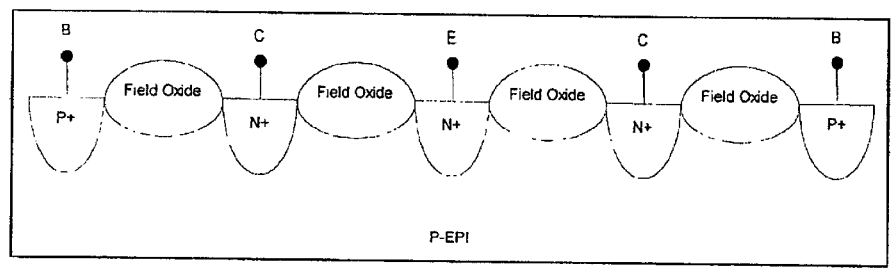
FIG. 36 illustrates a lateral NPN bipolar transistor.
Figure 38:
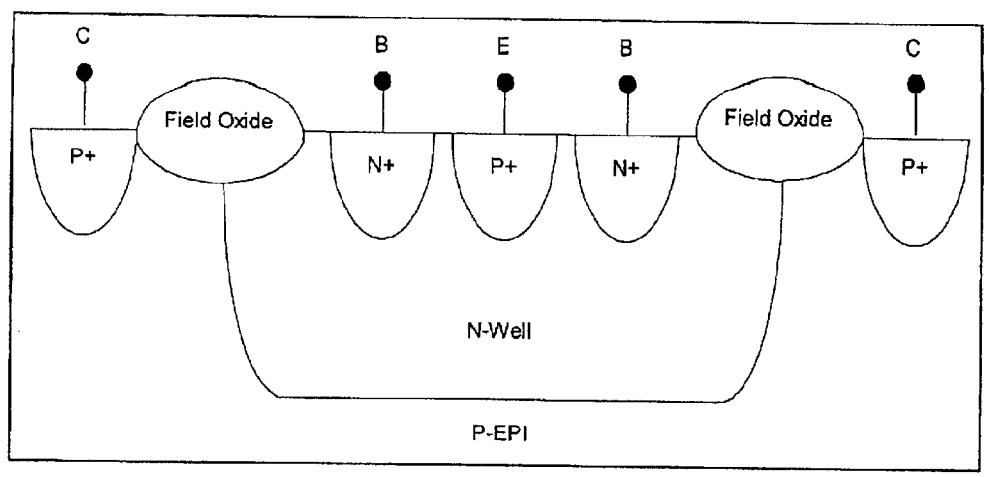
FIG. 38 illustrates a high-voltage vertical PNP bipolar transistor.
Figure 39:
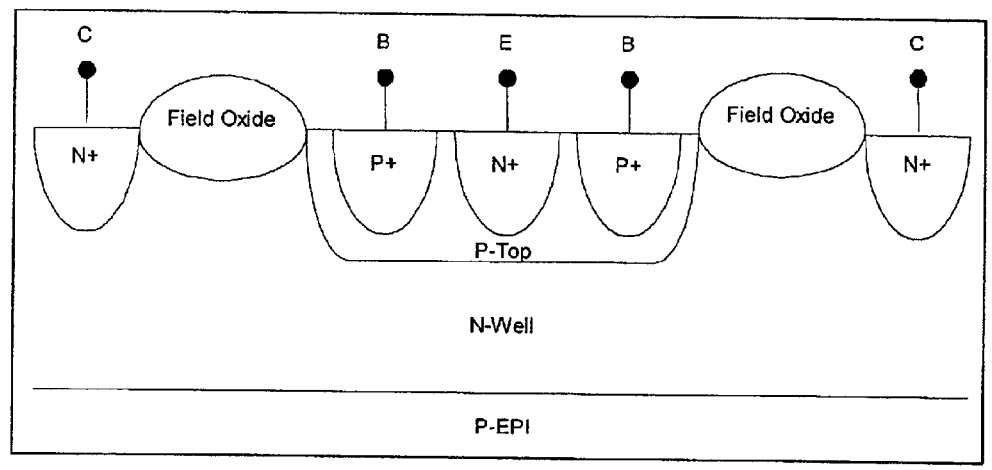
FIG. 39 illustrates a very-high-gain vertical NPN bipolar transistor.
Figure 40:
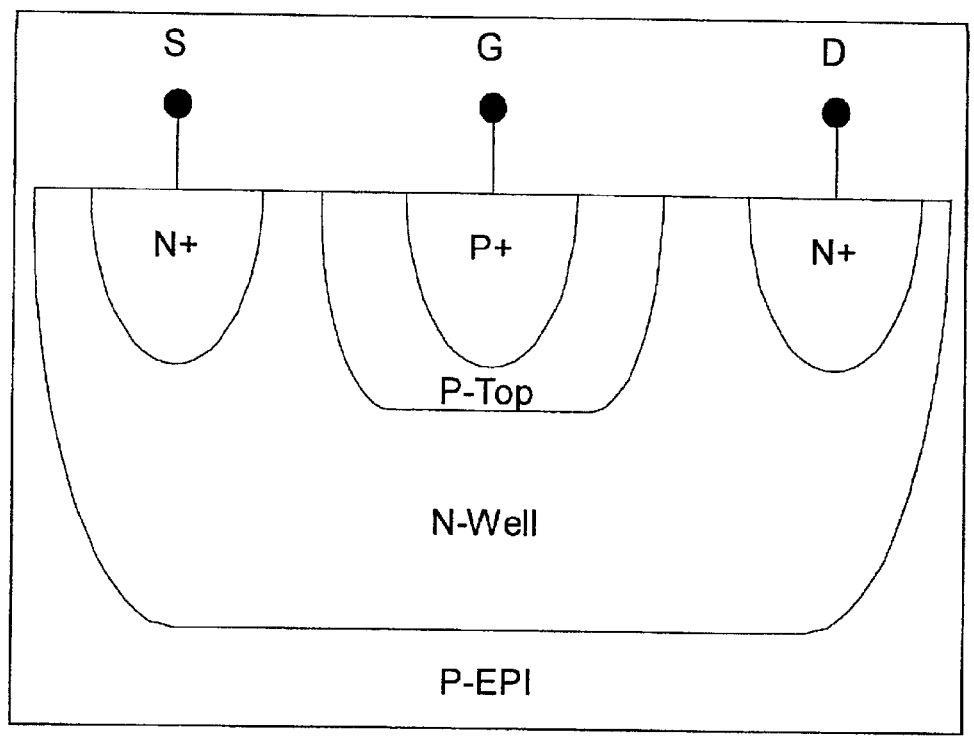
FIG. 40 illustrates a high-voltage N-JFET.

The core of the process that can be used to make numerous diverse components is a basic twelve-mask sequence CMOS process with standard gate oxide consisting of steps 1, 2, 3, 5, 6, 10, 11, 12 13, 14, 15, and 16 as illustrated in FIG. 1. This basic twelve-masks CMOS process uses a simple and low cost single P-Type dopant substrate [P-Type bulk substrate or (P-Epitaxial over P+ Bulk substrate)] with standard gate oxide and allows the following six active components to be integrated, namely a standard N-MOSFET with standard gate oxide, as shown in FIG. 19a; a standard P-MOSFET with standard gate oxide as shown in FIG. 20a; a high-voltage single extended N-MOSFET with standard gate oxide as shown in FIG. 28a; a high-voltage double extended N-MOSFET with standard gate oxide as shown in FIG. 30a; a lateral NPN bipolar transistor as shown in FIG. 36; a high-voltage vertical PNP bipolar transistor as shown in FIG. 38;

FIG. 2 shows the various active components that can be achieved with the various combinations of masks of the following standard gate oxide processes:

FIG. 3 describes a process which can be used to fabricate in addition to the basic CMOS process of FIG. 1 a N-Extended mask (Mask 8: N-Extended) so as to produce a N-Extended thirteen-mask CMOS process with standard gate oxide. As shown in FIG. 2, this N-Extended thirteen-mask CMOS process with standard gate oxide allows the integration of another mid-voltage single extended N-MOSFET and of another mid-voltage double-extended N-MOSFET over the six active components of the basic twelve-mask CMOS process with standard gate oxide so as to provide the integration of the following eight active components, namely a standard N-MOSFET with standard gate oxide as shown in FIG. 19a; a standard P-MOSFET with standard gate oxide as shown in FIG. 20a; a mid-voltage single extended N-MOSFET with standard gate oxide as shown in FIG. 22a; a mid-voltage double extended N-MOSFET with standard gate oxide as shown in FIG. 24a; a high-voltage single extended N-MOSFET with standard gate oxide as shown in FIG. 28a; a high-voltage double extended N-MOSFET with standard gate oxide as shown in FIG. 30a; a lateral NPN bipolar transistor as shown in FIG. 36; and a high-voltage vertical PNP bipolar transistor as shown in FIG. 38;

FIG. 4 describes a known process which integrates over the basic CMOS process of FIG. 1 a P-Top mask (Mask 9: P-Top) so as to produce a P-Top thirteen-masks Bipolar/CMOS process with standard gate oxide. As shown in FIG. 2, this P-Top thirteen-mask Bipolar/CMOS process with standard gate oxide allows the integration of another very-high-gain vertical NPN bipolar transistor and of another high-voltage N-JFET over the six active components of the basic twelve-mask CMOS process with standard gate oxide so as to provide the integration of the eight active components, namely a standard N-MOSFET with standard gate oxide as shown in FIG. 19a; a standard P-MOSFET with standard gate oxide as shown in FIG. 20a; a high-voltage single extended N-MOSFET with standard gate oxide as shown in FIG. 28a; a high-voltage double extended N-MOSFET with standard gate oxide as shown in FIG. 30a; a lateral NPN bipolar transistor as shown in FIG. 36; a high-voltage vertical PNP bipolar transistor as shown in FIG. 38; a very-high-gain vertical NPN bipolar transistor as shown in FIG. 39; and a high-voltage N-JFET as shown in FIG. 40.

FIG. 5 describes a process which integrates over the basic CMOS process of FIG. 1 the combination of a N-Extended mask (Mask 8: N-Extended) and of a P-Top mask (Mask 9: P-Top) so as to produce a N-Extended and P-Top fourteen-mask Bipolar/CMOS process with standard gate oxide. As shown in FIG. 2, this N-Extended and P-Top fourteen-mask Bipolar/CMOS process with standard gate oxide allows the integration of the other two active components of the N-Extended thirteen-mask CMOS process with standard gate oxide as well as of the other two active components of the P-Top thirteen-mask Bipolar/CMOS process with standard gate oxide over the six active components of the basic twelve-mask CMOS process with standard gate oxide so as to provide the integration of the ten active components, namely a standard N-MOSFET with standard gate oxide as shown in FIG. 19a; a standard P-MOSFET with standard gate oxide as shown in FIG. 20a; a mid-voltage single extended N-MOSFET with standard gate oxide as shown in FIG. 22a; a mid-voltage double extended N-MOSFET with standard gate oxide as shown in FIG. 24a; a high-voltage single extended N-MOSFET with standard gate oxide as shown in FIG. 28a; a high-voltage double extended N-MOSFET with standard gate oxide as shown in FIG. 30a; a lateral NPN bipolar transistor as shown in FIG. 36; a high-voltage vertical PNP bipolar transistor as shown in FIG. 38; a very-high-gain vertical NPN bipolar transistor as shown in FIG. 39; and a high-voltage N-JFET as shown in FIG. 40.

FIG. 6 describes a process which integrates over the basic CMOS process of FIG. 1 a P-Base mask (Mask 7: P-Base) so as to produce a P-Base thirteen-masks Bipolar/CMOS/DMOS process with standard gate oxide. As shown in FIG. 2, this P-Base thirteen-mask Bipolar/CMOS/DMOS process with standard gate oxide allows the integration of another standard Junction isolated N-MOSFET, of another mid-voltage single extended P-MOSFET, of another mid-voltage double extended P-MOSFET, of another mid-voltage single extended N-LDMOSFET, of another mid-voltage floating source N-LDMOSFET and of another high-voltage vertical NPN bipolar transistor over the six active components of the basic twelve-mask CMOS process with standard gate oxide so as to provide the integration of the twelve active components, namely a standard N-MOSFET with standard gate oxide as shown in FIG. 19a; a standard P-MOSFET with standard gate oxide as shown in FIG. 20a; a standard Junction isolated N-MOSFET with standard gate oxide as shown in FIG. 21a; a mid-voltage single extended P-MOSFET with standard gate oxide a FIG. 23a; a mid-voltage double extended P-MOSFET with standard gate oxide as shown in FIG. 25a; a mid-voltage single extended N-LDMOSFET with standard gate oxide as shown in FIG. 26a; a mid-voltage floating source N-LDMOSFET with standard gate oxide as shown in FIG. 27a; a high-voltage single extended N-MOSFET with standard gate oxide as shown in FIG. 28a; a high-voltage double extended N-MOSFET with standard gate oxide as shown in FIG. 30a; a lateral NPN bipolar transistor as shown in FIG. 36; a high-voltage vertical NPN bipolar transistor as shown in FIG. 37; and a high-voltage vertical PNP bipolar transistor as shown in FIG. 38.

Figure 23A:
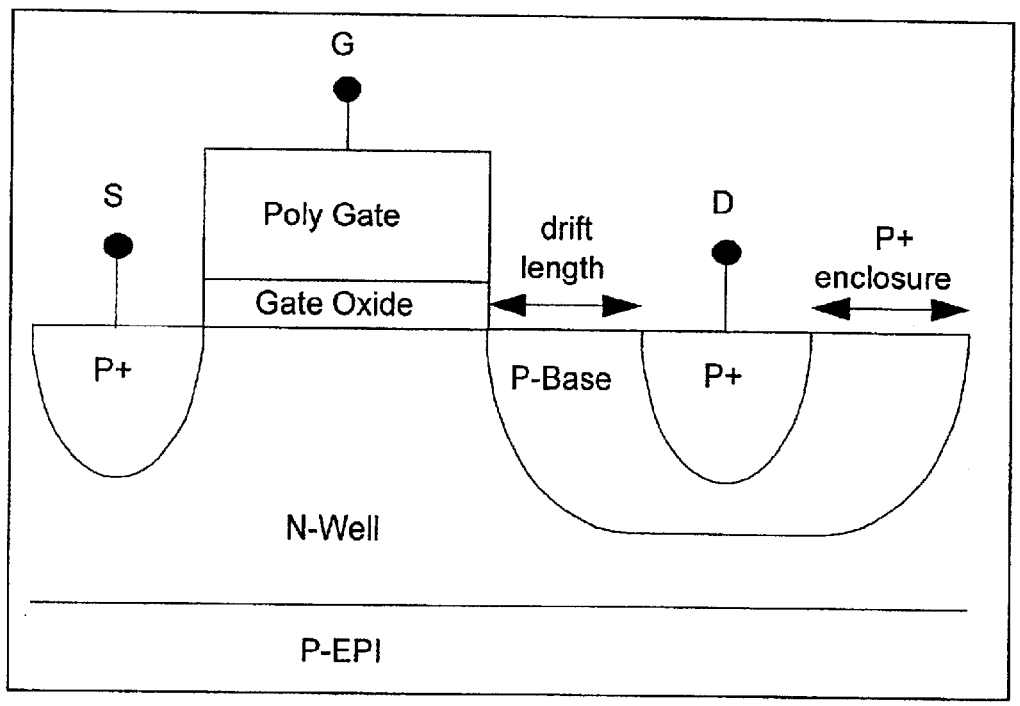
FIG. 23a illustrates a mid-voltage single extended P-MOSFET with standard gate oxide.

FIG. 7 describes a process which integrates over the basic CMOS process of FIG. 1 the combination of a P-Base mask (Mask 7: P-Base) and of a N-Extended mask (Mask 8: N-Extended) so as to produce a P-Base and N-Extended fourteen-masks Bipolar/CMOS/DMOS process with standard gate oxide. As shown in FIG. 2, this P-Base and N-Extended fourteen-mask Bipolar/CMOS/DMOS process with standard gate oxide allows the integration of the other six active components of the P-Base thirteen-mask Bipolar/CMOS/DMOS process with standard gate oxide and of the other two active components of the N-Extended thirteen-mask CMOS process with standard gate oxide over the six active components of the basic twelve-mask CMOS process with standard gate oxide so as to provide the integration of the fourteen active components, namely a standard N-MOSFET with standard gate oxide as shown in FIG. 19a; a standard P-MOSFET with standard gate oxide as shown in FIG. 20a; a standard junction isolated N-MOSFET with standard gate oxide as shown in FIG. 21a; a mid-voltage single extended N-MOSFET with standard gate oxide as show in FIG. 22a; a mid-voltage single extended P-MOSFET with standard gate oxide as shown in FIG. 23a a mid-voltage double extended N-MOSFET with standard gate oxide as shown in; FIG. 24a; a mid-voltage double extended P-MOSFET with standard gate oxide as shown in FIG. 25a; a mid-voltage single extended N-LDMOSFET with standard gate oxide as shown in FIG. 26a; a mid-voltage floating source N-LDMOSFET with standard gate oxide as shown in FIG. 27a; a high-voltage single extended N-MOSFET with standard gate oxide as shown in FIG. 28a; a high-voltage double extended N-MOSFET with standard gate oxide as shown in FIG. 30a; a lateral NPN bipolar transistor as shown in; FIG. 37 a high-voltage vertical NPN bipolar transistor as shown in FIG. 36; and a high-voltage vertical PNP bipolar transistor as shown in FIG. 38.

FIG. 8 describes a process which integrates over the basic CMOS process of FIG. 1 the combination of a P-Base mask (Mask 7: P-Base) and of a P-Top mask (Mask 9: P-Top) so as to produce a P-Base and P-Top fourteen-mask Bipolar/CMOS/DMOS process with standard gate oxide.

Figure 21A:
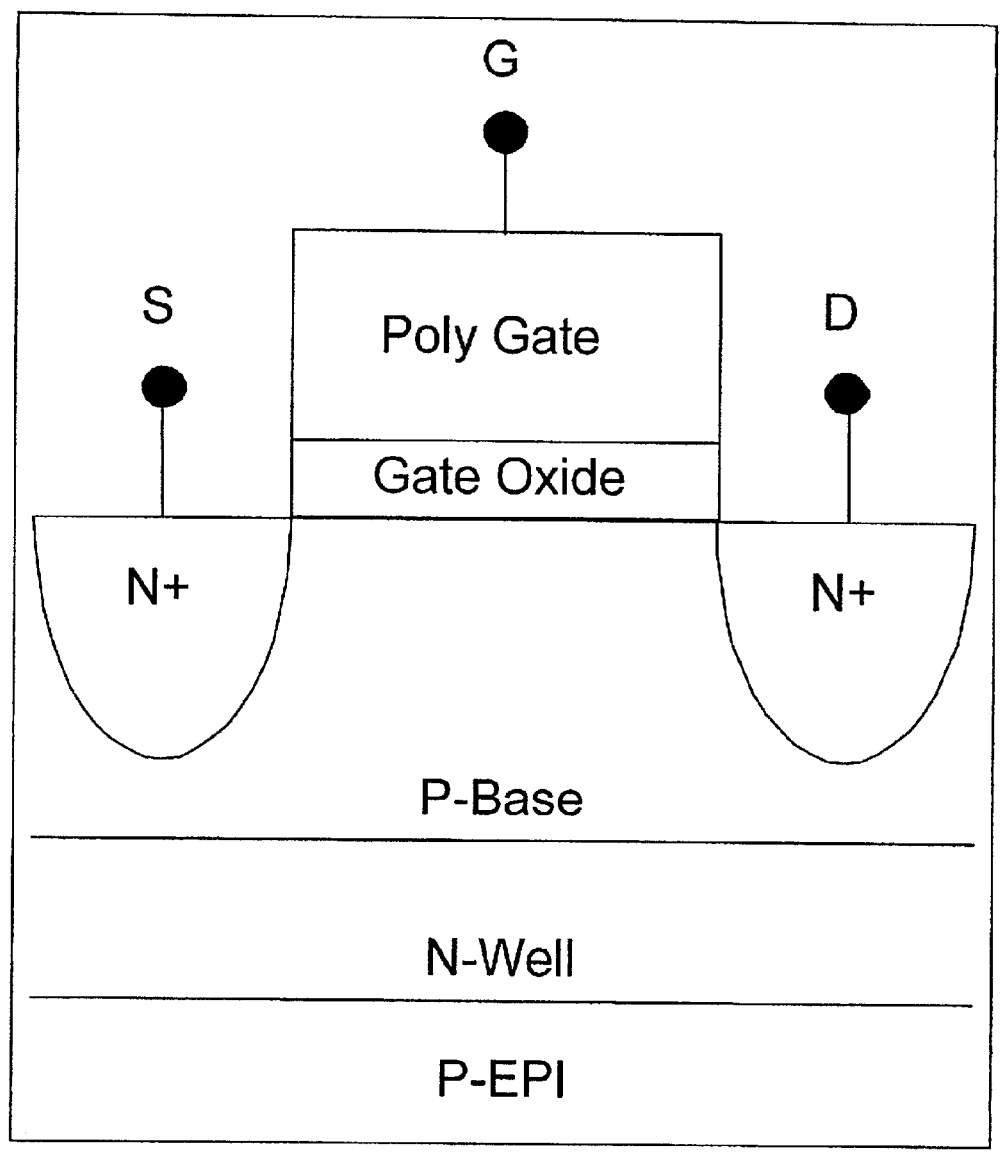
FIG. 21a illustrates a standard Junction isolated N-MOSFET with standard gate oxide.
Figure 25A:
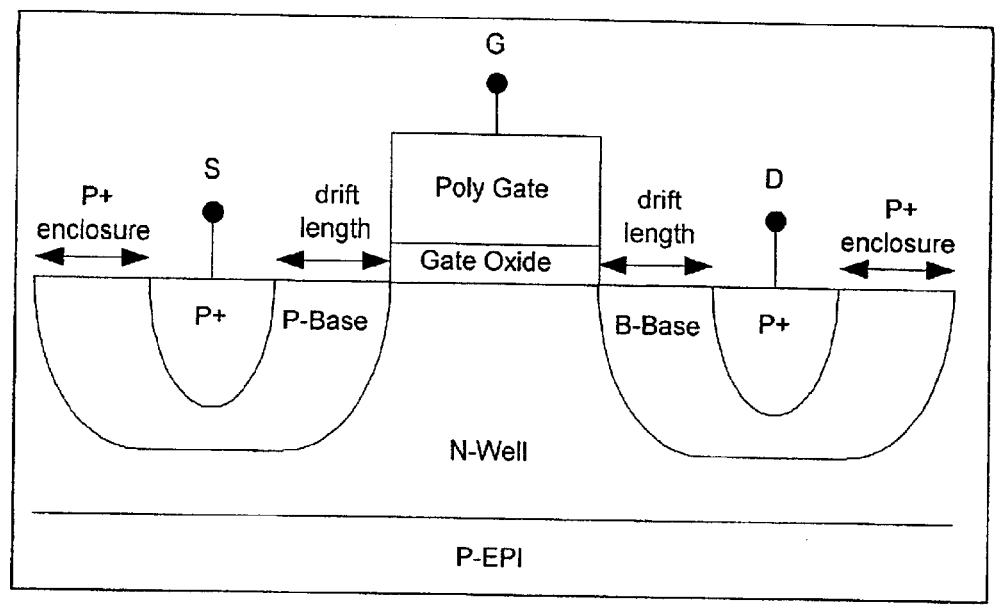
FIG. 25a illustrates a mid-voltage double extended P-MOSFET with standard gate oxide.
Figure 26A:
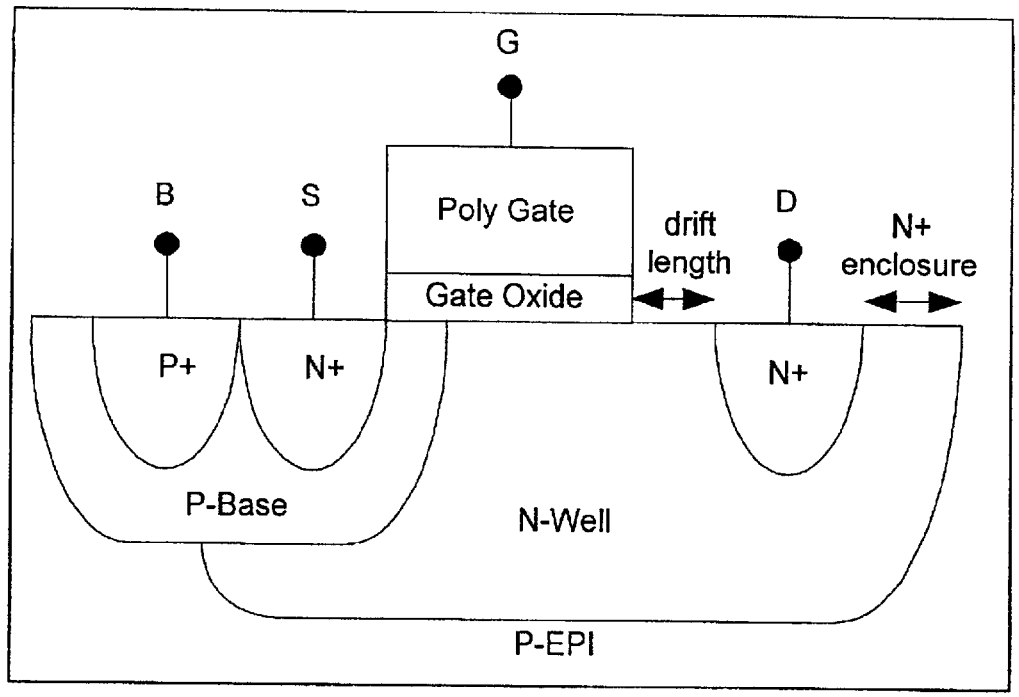
FIG. 26a illustrates a mid-voltage single extended N-LDMOSFET with standard gate oxide.
Figure 27A:
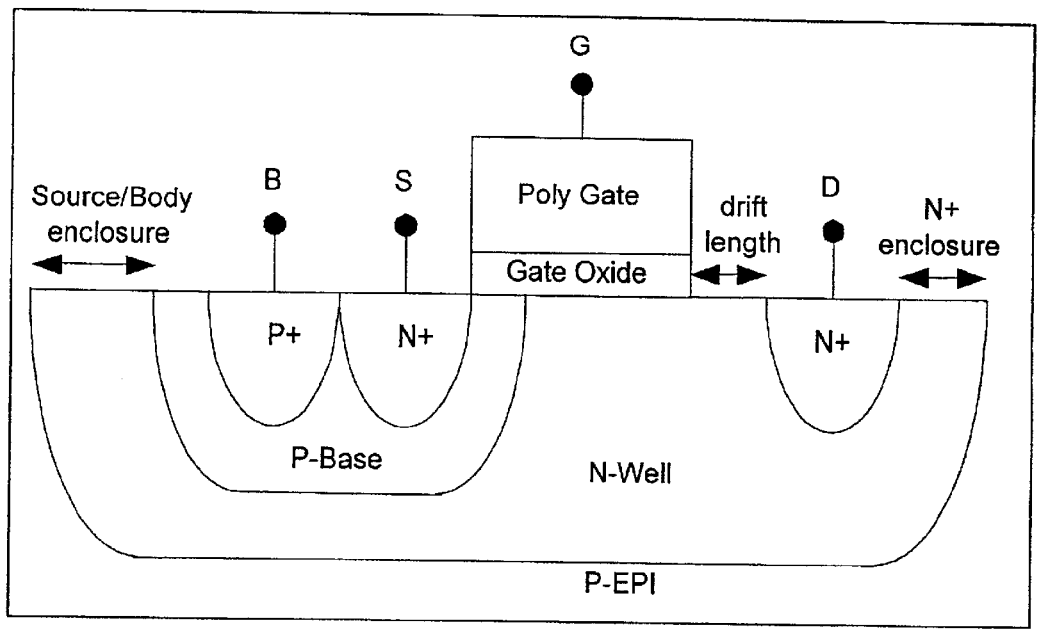
FIG. 27a illustrates a mid-voltage floating source N-LDMOSFET with standard gate oxide.
Figure 29A:
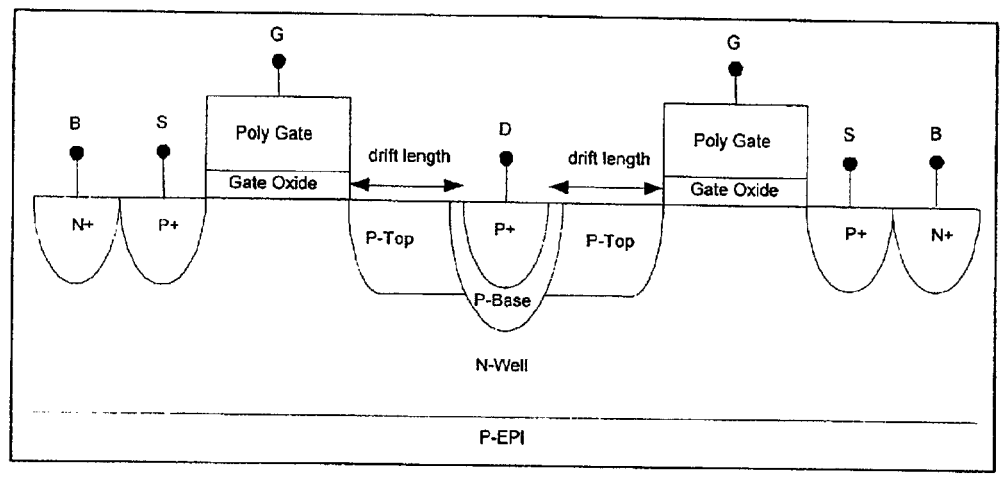
FIG. 29a illustrates a high-voltage single extended P-MOSFET with standard gate oxide.
Figure 31A:
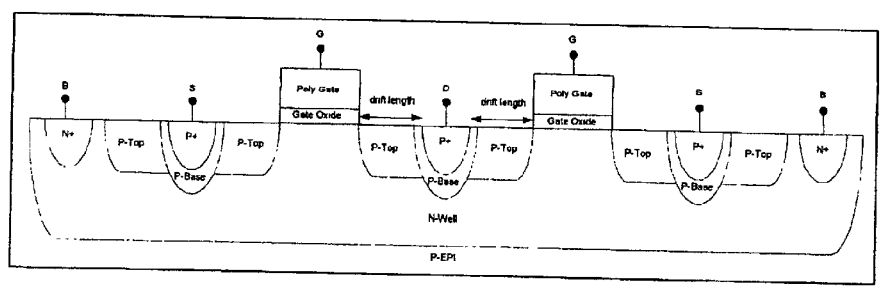
FIG. 31a illustrates a high-voltage double extended P-MOSFET with standard gate oxide.
Figure 32A:
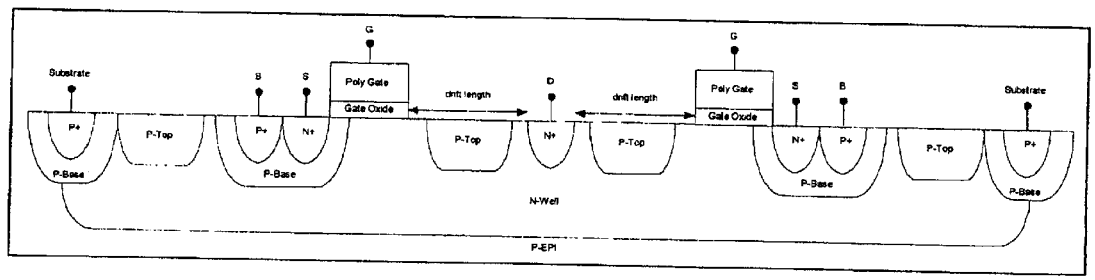
FIG. 32a illustrates a high-voltage double extended N-LDMOSFET with standard gate oxide.
Figure 33A:
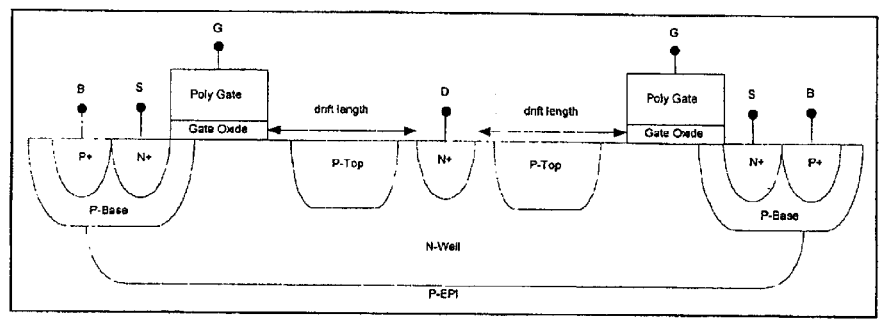
FIG. 33a illustrates a very-high-voltage single extended N-LDMOSFET with standard gate oxide.
Figure 34A:
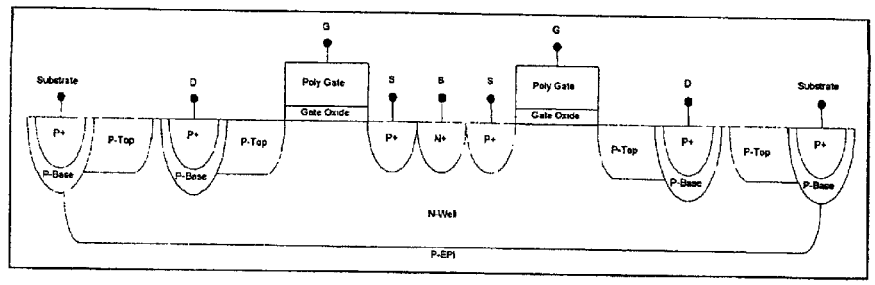
FIG. 34a illustrates a very-high-voltage single extended P-MOSFET with standard gate oxide.
Figure 35A:
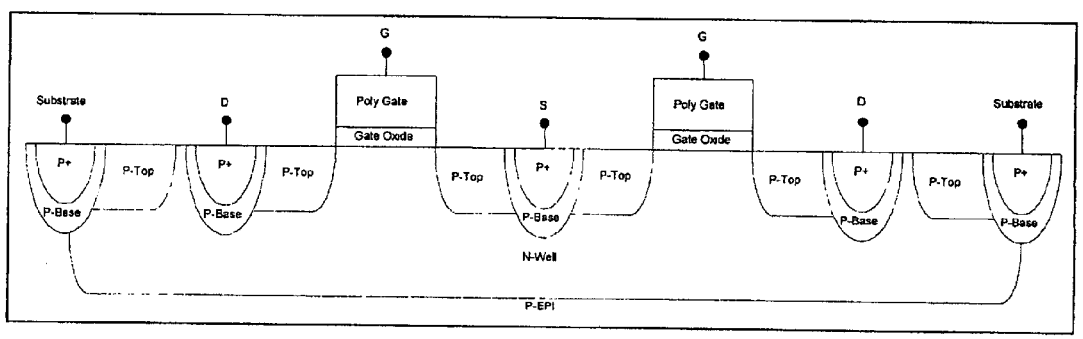
FIG. 35a illustrates a very-high-voltage double extended P-MOSFET with standard gate oxide.
Figure 37:
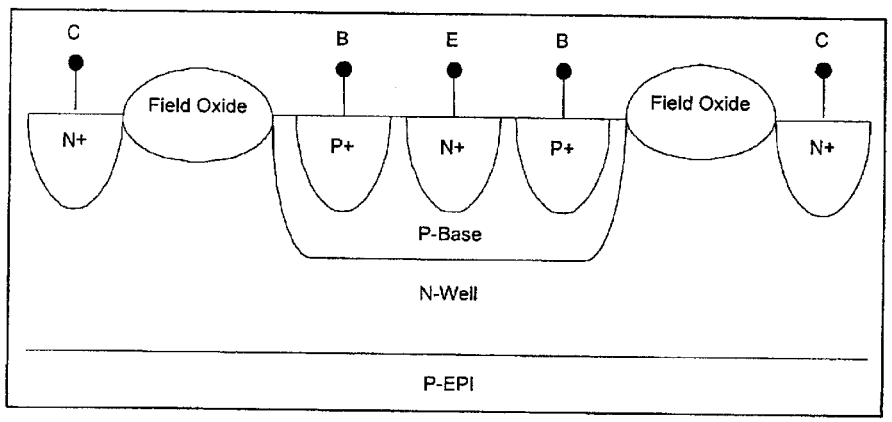
FIG. 37 illustrates a high-voltage vertical NPN bipolar transistor.

As shown in FIG. 2, this P-Base and P-Top fourteen-mask Bipolar/CMOS/DMOS process with standard gate oxide allows the integration of the other six active components of the P-Base thirteen-mask Bipolar/CMOS/DMOS process with standard gate oxide, of the other two active components of the P-Top thirteen-mask Bipolar/CMOS process with standard gate oxide, of another high-voltage single extended P-MOSFET, of another high-voltage double extended P-MOSFET, of another high-voltage double extended N-LDMOSFET, of another very-high-voltage single extended N-LDMOSFET, of another very-high-voltage single extended P-MOSFET, of another very-high-voltage double extended P-MOSFET, and of another very-high-voltage Lateral Insulated Gate Bipolar transistor LIGBT over the six active components of the basic twelve-mask CMOS process with standard gate oxide so as to provide the integration of twenty-one active components, namely a standard N-MOSFET with standard gate oxide is shown in FIG. 19a; a standard P-MOSFET with standard gate oxide is shown in FIG. 20a; a standard Junction isolated N-MOSFET with standard gate oxide is shown in FIG. 21a; a mid-voltage single extended P-MOSFET with standard gate oxide is shown in FIG. 23a; a mid-voltage double extended P-MOSFET with standard gate oxide is shown in FIG. 25a; a mid-voltage single extended N-LDMOSFET with standard gate oxide is shown in FIG. 26a; a mid-voltage floating source N-LDMOSFET with standard gate oxide is shown in FIG. 27a; a high-voltage single extended N-MOSFET with standard gate oxide is shown in FIG. 28a; a high-voltage single extended P-MOSFET with standard gate oxide FIG. 30a a high-voltage double extended N-MOSFET with standard gate oxide is shown in FIG. 29a; a high-voltage double extended P-MOSFET with standard gate oxide is shown in FIG. 31a; a high-voltage double extended N-LDMOSFET with standard gate oxide is shown in FIG. 32a; a very-high-voltage single extended N-LDMOSFET with standard gate oxide is shown in FIG. 33a; a very-high-voltage single extended P-MOSFET with standard gate oxide is shown in FIG. 34a; a very-high-voltage double extended P-MOSFET with standard gate oxide FIG. 36 a lateral NPN bipolar transistor is shown in FIG. 35a; a high-voltage vertical NPN bipolar transistor is shown in FIG. 37; a high-voltage vertical PNP bipolar transistor is shown in FIG. 38; a very-high-gain vertical NPN bipolar transistor is shown in FIG. 39; a high-voltage N-JFET is shown in FIG. 40; And a very-high-voltage Lateral Insulated Gate Bipolar transistor LIGBT with standard gate oxide as shown in FIG. 41a.

FIG. 9 describes a very important aspect of the process which integrates over the basic CMOS process of FIG. 1 the combination of a P-Base mask (Mask 7: P-Base), of a N-Extended mask (Mask 8: N-Extended) and of a P-Top mask (Mask 9: P-Top) as to produce a P-Base, N-Extended and P-Top fifteen-mask Bipolar/CMOS/DMOS process with standard gate oxide.

Figure 41A:
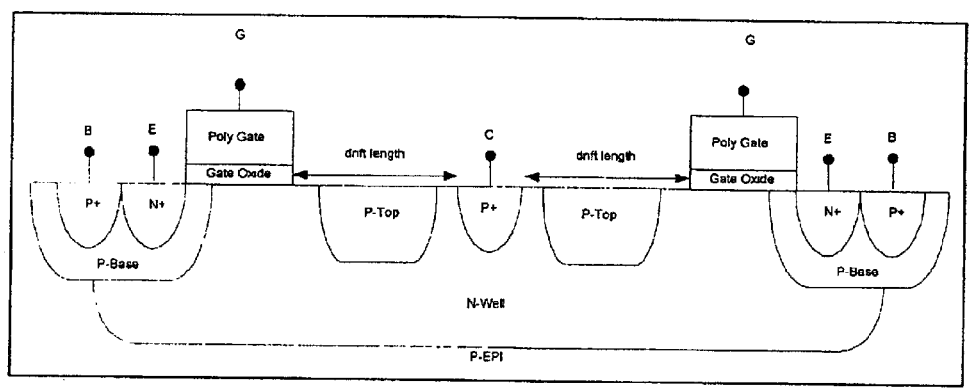
FIG. 41a illustrates a very-high-voltage LIGBT with standard gate oxide.

As shown on FIG. 2, this P-Base, N-Extended and P-Top fifteen-mask Bipolar/CMOS/DMOS process with standard gate oxide allows the integration of the other fifteen active components of the P-Base and P-Top fourteen-mask Bipolar/CMOS/DMOS process with standard gate oxide and of the other two active components of the N-Extended thirteen-mask CMOS process with standard gate oxide over the six active components of the basic twelve-mask CMOS process with standard gate oxide so as to provide the integration of the f twenty-three active components, namely a standard N-MOSFET with standard gate oxide as shown in FIG. 19a; a standard P-MOSFET with standard gate oxide as shown in FIG. 20a; a standard Junction isolated N-MOSFET with standard gate oxide as shown in FIG. 21a; a mid-voltage single extended N-MOSFET with standard gate oxide as shown in FIG. 22a; a mid-voltage single extended P-MOSFET with standard gate oxide as shown in FIG. 23a; a mid-voltage double extended N-MOSFET with standard gate oxide as shown in FIG. 24a; a mid-voltage double extended P-MOSFET with standard gate oxide as shown in FIG. 25a; a mid-voltage single extended N-LDMOSFET with standard gate oxide as shown in FIG. 26a; a mid-voltage floating source N-LDMOSFET with standard gate oxide as shown in FIG. 27a; a high-voltage single extended N-MOSFET with standard gate oxide as shown in FIG. 28a; a high-voltage single extended P-MOSFET with standard gate oxide as shown in FIG. 29a; a high-voltage double extended N-MOSFET with standard gate oxide as shown in FIG. 30a; a high-voltage double extended P-MOSFET with standard gate oxide as shown in FIG. 31a; a high-voltage double extended N-LDMOSFET with standard gate oxide as shown in FIG. 32a; a very-high-voltage single extended N-LDMOSFET with standard gate oxide as shown in FIG. 33a; a very-high-voltage single extended P-MOSFET with standard gate oxide as shown in FIG. 34a; a very-high-voltage double extended P-MOSFET with standard gate oxide as shown in FIG. 35a; a lateral NPN bipolar transistor as shown in FIG. 36; a high-voltage vertical NPN bipolar transistor as shown in FIG. 37; a high-voltage vertical PNP bipolar transistor as shown in FIG. 38; a very-high-gain vertical NPN bipolar transistor as shown in FIG. 39; a high-voltage N-JFET as shown in FIG. 40; and a very-high-voltage Lateral Insulated Gate Bipolar transistor LIGBT with standard gate oxide as shown in FIG. 41a.

Figure 10:
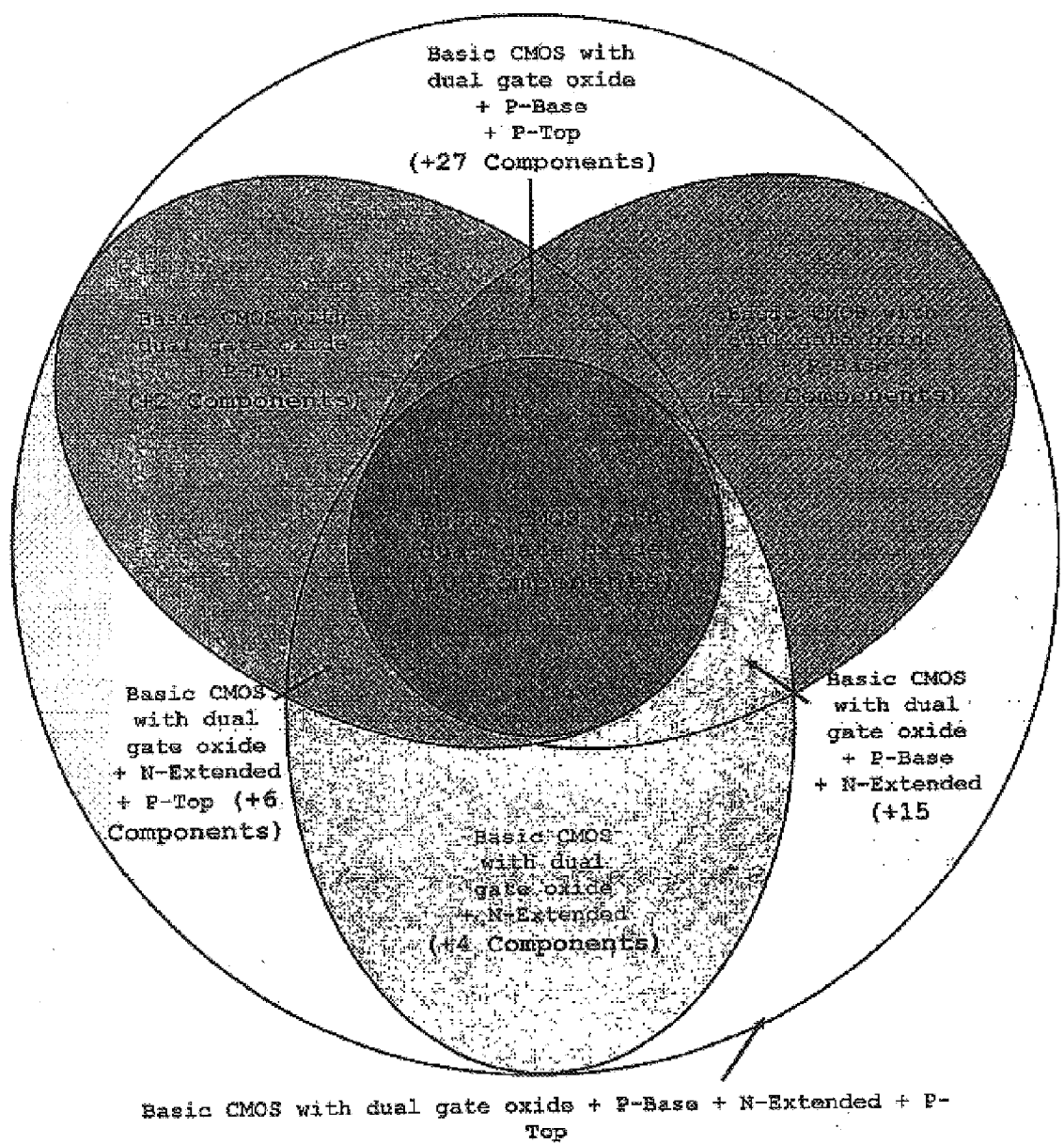
FIG. 10 lists the number of active components associated with the various combinations of masks of dual gate oxide processes.
Figure 19B:
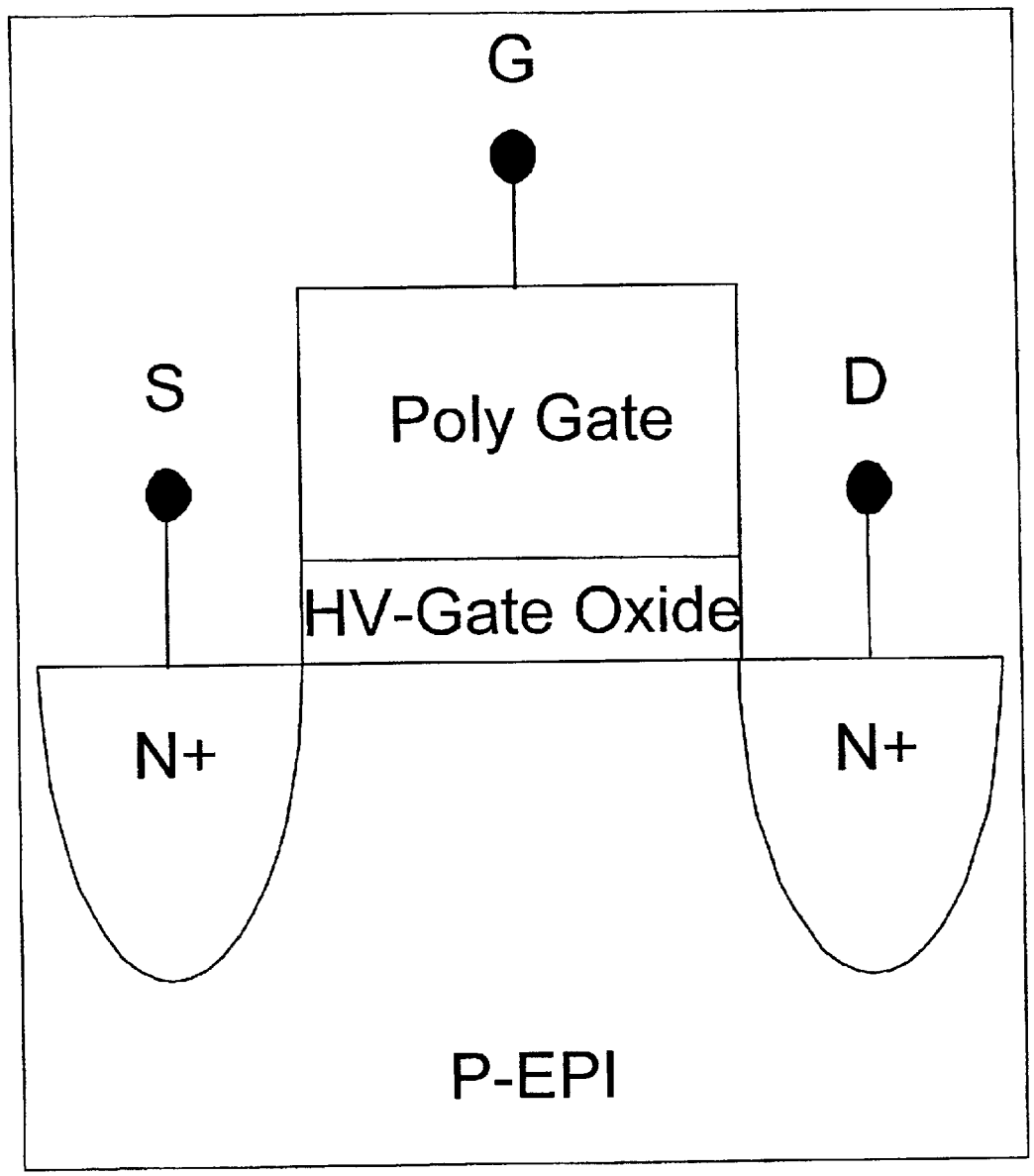
FIG. 19b illustrates a standard N-MOSFET LIGBT with high-voltage gate oxide.
Figure 20B:
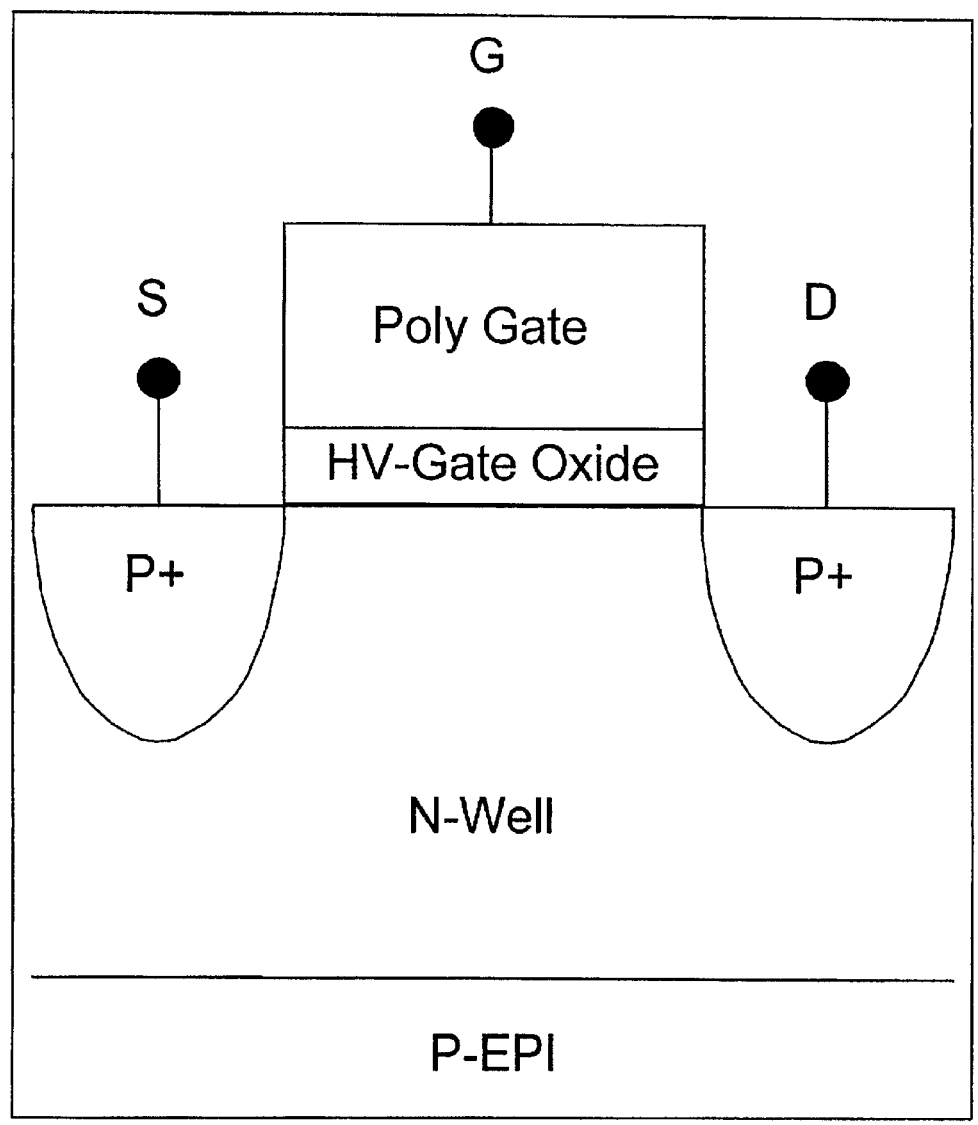
FIG. 20b illustrates a standard P-MOSFET with high-voltage gate oxide.
Figure 28B:
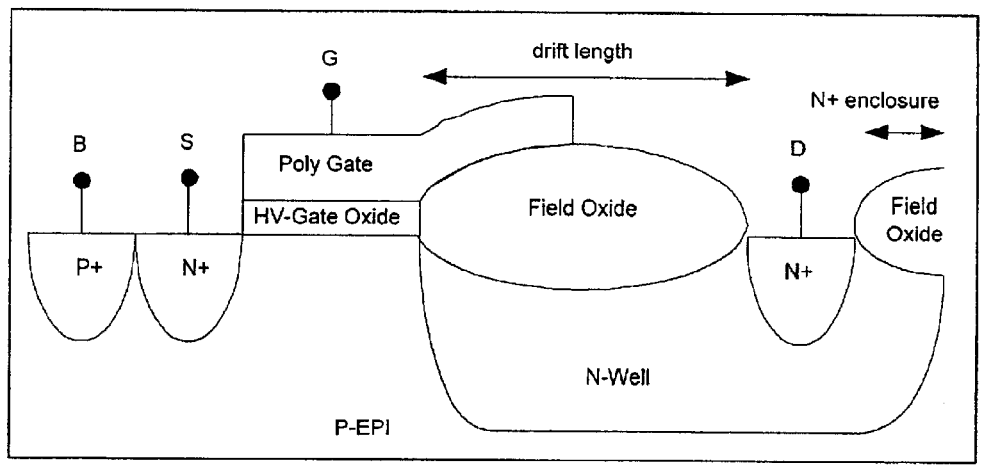
FIG. 28b illustrates a high-voltage single extended N-MOSFET with high-voltage gate oxide.
Figure 30B:
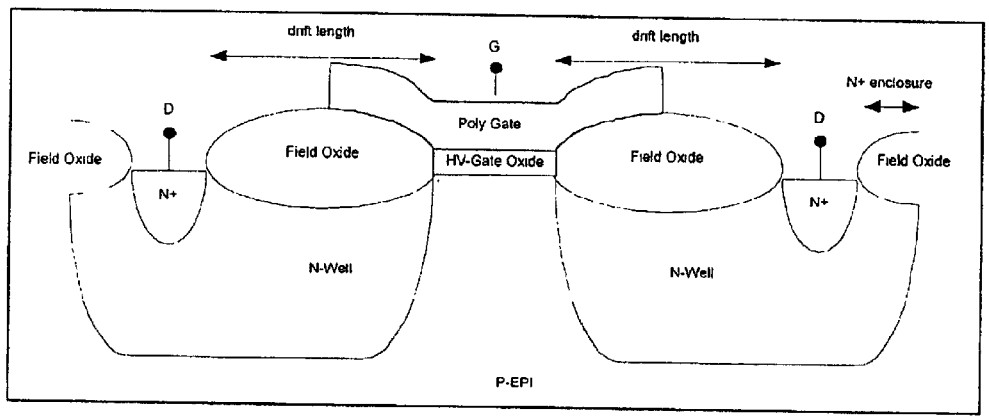
FIG. 30b illustrates a high-voltage double extended N-MOSFET with high-voltage gate oxide.

FIG. 10 lists the various active components obtained by a process in accordance with the invention with the various combinations of masks of the following dual (standard and high-voltage) gate oxide processes:

FIG. 11 describes a known process which integrates over the basic CMOS process of FIG. 1 a High-voltage mask (Mask 4: High-voltage Gate Oxide) so as to produce a Dual gate oxide basic thirteen-mask CMOS process. As shown in FIG. 2 and FIG. 10, this Dual gate oxide basic thirteen-mask CMOS process allows the integration of another standard N-MOSFET with high-voltage gate oxide, of another standard P-MOSFET with high-voltage gate oxide, of another high-voltage single extended N-MOSFET with high-voltage gate oxide and of another high-voltage double extended N-MOSFET with high-voltage gate oxide over the basic twelve-mask CMOS process with standard gate oxide so as to provide the integration of the ten active components, namely a standard N-MOSFET with standard gate oxide as shown in FIG. 19a; a standard N-MOSFET with high-voltage gate oxide as shown in FIG. 19b; a standard P-MOSFET with standard gate oxide as shown in FIG. 20a; a standard P-MOSFET with high-voltage gate oxide as shown in FIG. 20b; a high-voltage single extended N-MOSFET with standard gate oxide as shown in FIG. 28a; a high-voltage single extended N-MOSFET with high-voltage gate oxide as shown in FIG. 28b; a high-voltage double extended N-MOSFET with standard gate oxide as shown in FIG. 30a; a high-voltage double extended N-MOSFET with high-voltage gate oxide as shown in FIG. 30b; a lateral NPN bipolar transistor as shown in FIG. 36; and a high-voltage vertical PNP bipolar transistor as shown in FIG. 38.

FIG. 12 describes a process which integrates over the basic CMOS process of FIG. 1 a High-voltage mask (Mask 4: High-voltage Gate Oxide) and a P-Top mask (Mask 9: P-Top) so as to produce a Dual gate oxide P-Top fourteen-mask Bipolar/CMOS process. As shown in FIG. 2 and FIG. 10, this Dual gate oxide P-Top fourteen-mask Bipolar/CMOS process allows the integration of the two other components of the P-Top thirteen-mask CMOS process with standard gate oxide over the ten active components of the Dual gate oxide basic thirteen-mask CMOS process so as to provide the integration of the twelve active components, namely a standard N-MOSFET with standard gate oxide as shown in FIG. 19a; a standard N-MOSFET with high-voltage gate oxide as shown in FIG. 19b; a standard P-MOSFET with standard gate oxide as shown in FIG. 20a; a standard P-MOSFET with high-voltage gate oxide as shown in FIG. 20b; a high-voltage single extended N-MOSFET with standard gate oxide as shown in FIG. 28a; a high-voltage single extended N-MOSFET with high-voltage gate oxide as shown in FIG. 28b; a high-voltage double extended N-MOSFET with standard gate oxide as shown in FIG. 30a; a high-voltage double extended N-MOSFET with high-voltage gate oxide as shown in FIG. 30b; a lateral NPN bipolar transistor as shown in FIG. 36; a high-voltage vertical PNP bipolar transistor as shown in FIG. 38; a very-high-gain vertical NPN bipolar transistor as shown in FIG. 39; and a high-voltage N-JFET as shown in FIG. 40.

Figure 22B:
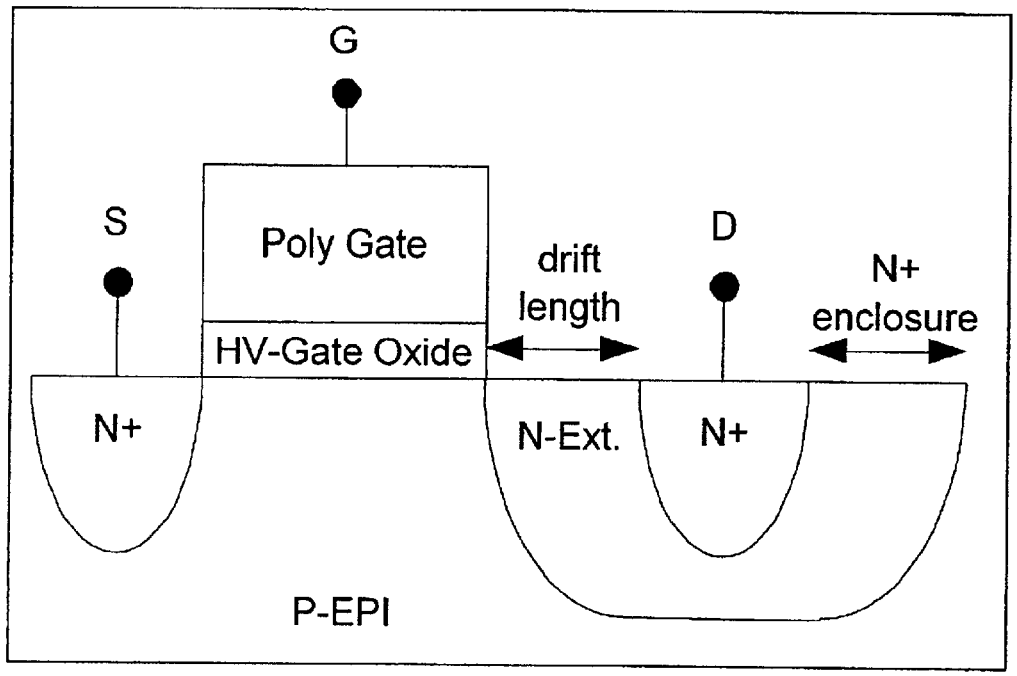
FIG. 22b illustrates a mid-voltage single extended N-MOSFET with high-voltage gate oxide.
Figure 24B:
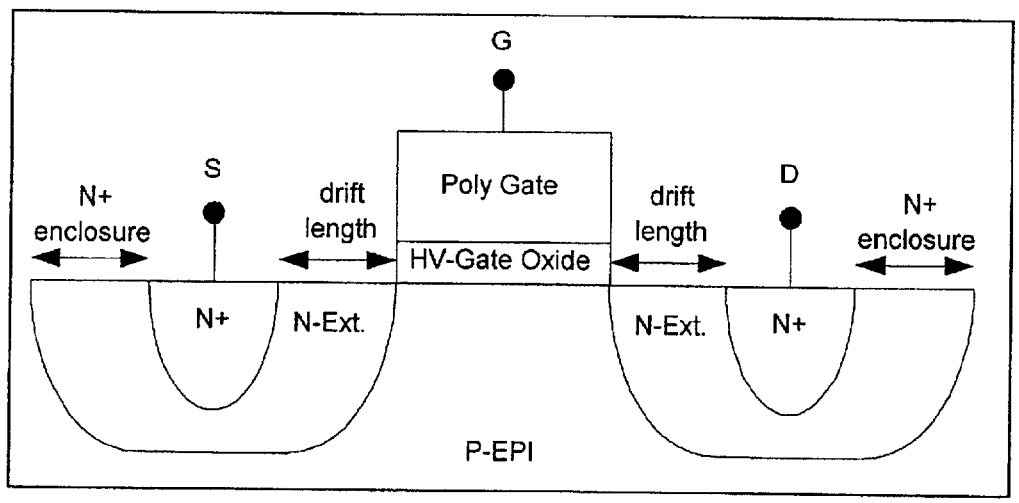
FIG. 24b illustrates a mid-voltage double extended N-MOSFET with high-voltage gate oxide.

FIG. 13 describes a known process which integrates over the basic CMOS process of FIG. 1 a High-voltage mask (Mask 4: High-voltage Gate Oxide) and a N-Extended mask (Mask 8: N-Extended) so as to produce a Dual gate oxide N-Extended fourteen-mask CMOS process. As shown in FIG. 2 and FIG. 10, this Dual gate oxide N-Extended fourteen-mask CMOS process allows the integration of the two other components of the N-Extended thirteen-mask CMOS process with standard gate oxide, of another mid-voltage single extended N-MOSFET with high-voltage gate oxide and of another mid-voltage double extended N-MOSFET with high-voltage gate over the ten active components of the Dual gate oxide basic thirteen-mask CMOS process so as to provide the integration of the fourteen active components, namely a standard N-MOSFET with standard gate oxide as shown in FIG. 19a; a standard N-MOSFET with high-voltage gate oxide as shown in FIG. 19b; a standard P-MOSFET with standard gate oxide as shown in FIG. 20a; a standard P-MOSFET with high-voltage gate oxide as shown in FIG. 20b; a mid-voltage single extended N-MOSFET with standard gate oxide as shown in FIG. 22a; a mid-voltage single extended N-MOSFET with high-voltage gate oxide as shown in FIG. 22b; a mid-voltage double extended N-MOSFET with standard gate oxide as shown in FIG. 24a; a mid-voltage double extended N-MOSFET with high-voltage gate oxide as shown in FIG. 24b; a high-voltage single extended N-MOSFET with standard gate oxide as shown in FIG. 28a; a high-voltage single extended N-MOSFET with high-voltage gate oxide as shown in FIG. 28b a high-voltage double extended N-MOSFET with standard gate oxide as shown in FIG. 30a; a high-voltage double extended N-MOSFET with high-voltage gate oxide as shown in FIG. 30b; a lateral NPN bipolar transistor as shown in FIG. 36; and a high-voltage vertical PNP bipolar transistor as shown in FIG. 38.

FIG. 14 describes a process which integrates over the basic CMOS process of FIG. 1 a High-voltage mask (Mask 4: High-voltage Gate Oxide), a N-Extended mask (Mask 8: N-Extended) and a P-Top mask (Mask 9: P-Top) so as to produce a Dual gate oxide N-Extended and P-Top fifteen-mask Bipolar/CMOS process. As shown in FIG. 2 and FIG. 10, this Dual gate oxide N-Extended and P-Top fifteen-mask Bipolar/CMOS process allows the integration of the other four active components of the Dual gate oxide N-Extended fourteen-masks CMOS process and of the other two active components of the Dual gate oxide P-Top fourteen-masks Bipolar/CMOS process over the ten active components of the Dual gate oxide basic thirteen-mask CMOS process so as to provide the integration of the sixteen active components, namely a standard N-MOSFET with standard gate oxide as shown in FIG. 19a; a standard N-MOSFET with high-voltage gate oxide as shown in FIG. 19b; a standard P-MOSFET with standard gate oxide as shown in FIG. 20a; a standard P-MOSFET with high-voltage gate oxide as shown in FIG. 20b; a mid-voltage single extended N-MOSFET with standard gate oxide as shown in FIG. 22a; a mid-voltage single extended N-MOSFET with high-voltage gate oxide as shown in FIG. 22b; a mid-voltage double extended N-MOSFET with standard gate oxide as shown in FIG. 24a; a mid-voltage double extended N-MOSFET with high-voltage gate oxide as shown in FIG. 24b; a high-voltage single extended N-MOSFET with standard gate oxide as shown in FIG. 28a; a high-voltage single extended N-MOSFET with high-voltage gate oxide as shown in FIG. 28b; a high-voltage double extended N-MOSFET with standard gate oxide as shown in FIG. 30a; a high-voltage double extended N-MOSFET with high-voltage gate oxide as shown in FIG. 30b; a lateral NPN bipolar transistor as shown in FIG. 36; a high-voltage vertical PNP bipolar transistor as shown in FIG. 38; a very-high-gain vertical NPN bipolar transistor as shown in FIG. 39; and a high-voltage N-JFET as shown in FIG. 40.

Figure 21B:
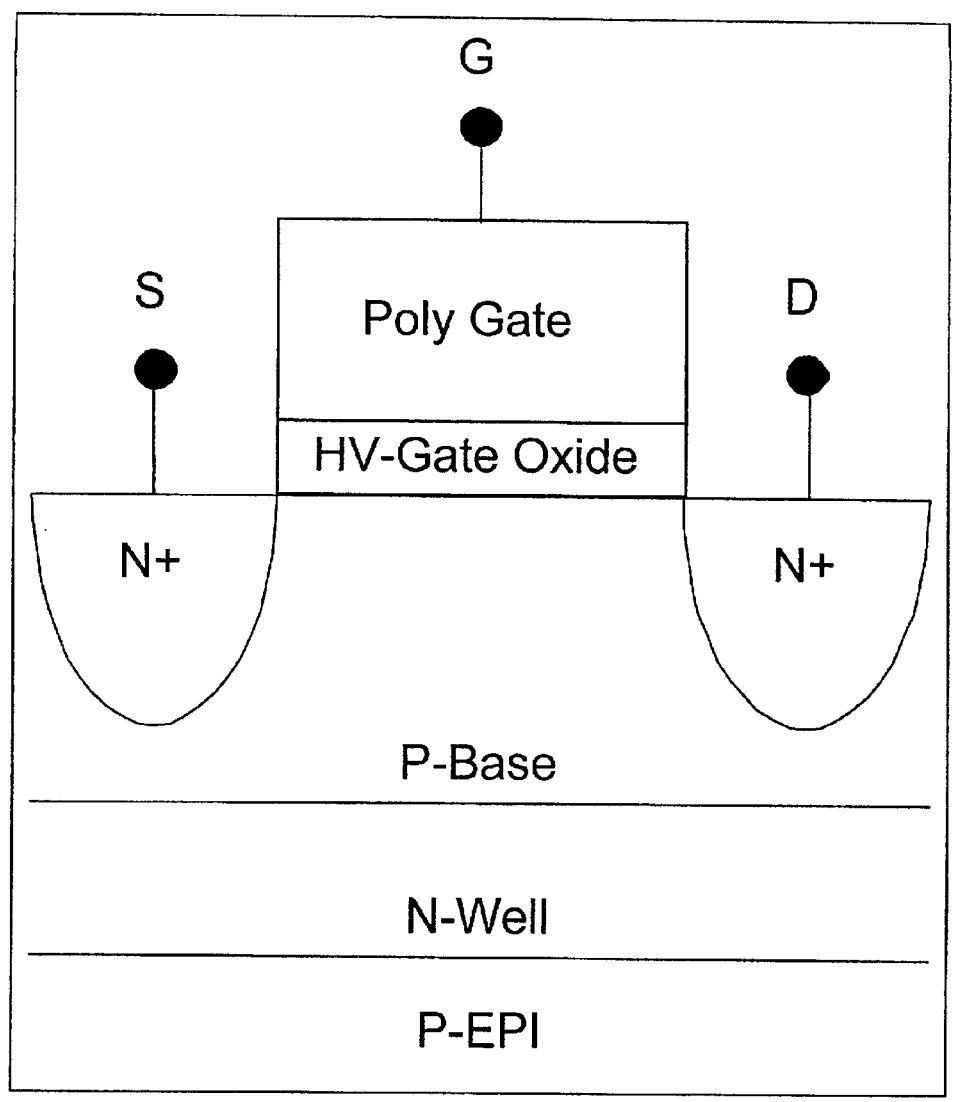
FIG. 21b illustrates a standard Junction isolated N-MOSFET with high-voltage gate oxide.
Figure 23B:
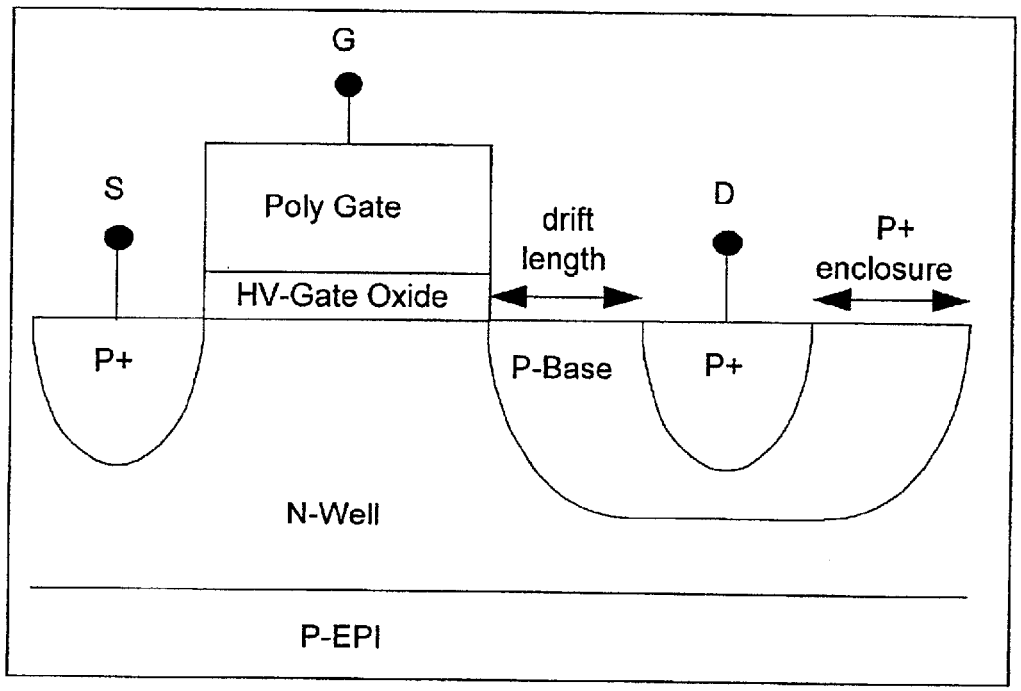
FIG. 23b illustrates a mid-voltage single extended P-MOSFET with high-voltage gate oxide.
Figure 25B:
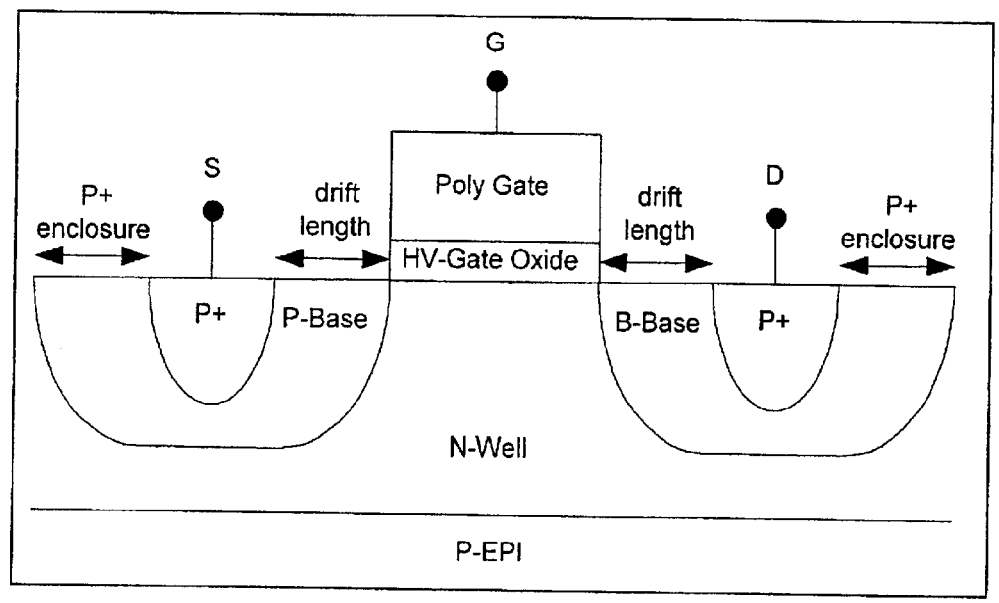
FIG. 25b illustrates a mid-voltage double extended P-MOSFET with high-voltage gate oxide.
Figure 26B:
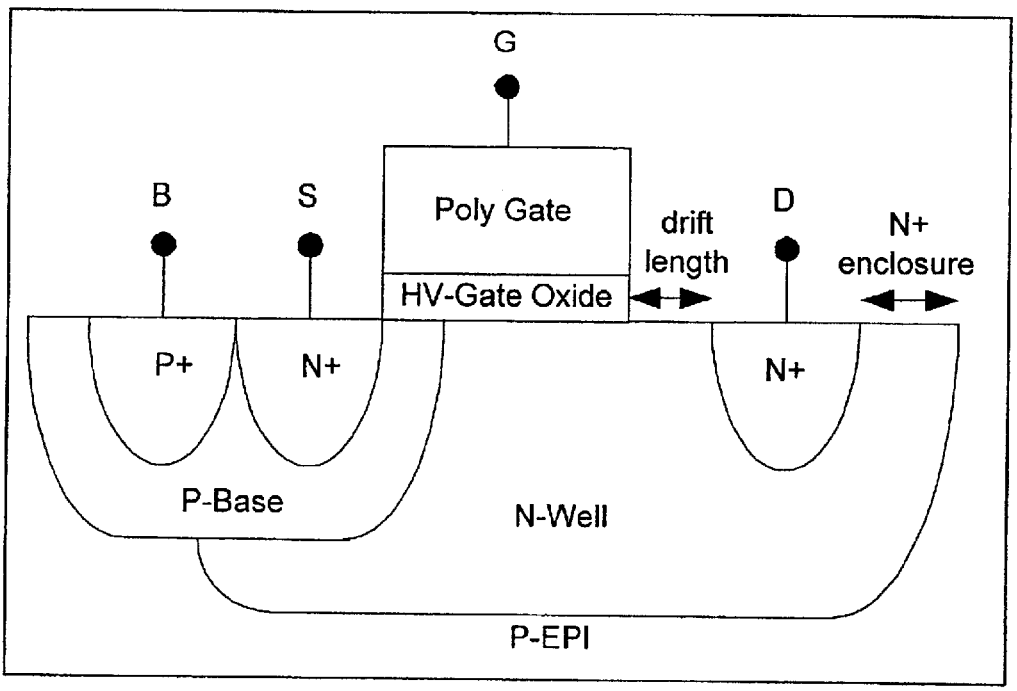
FIG. 26b illustrates a mid-voltage single extended N-LDMOSFET with high-voltage gate oxide.
Figure 27B:
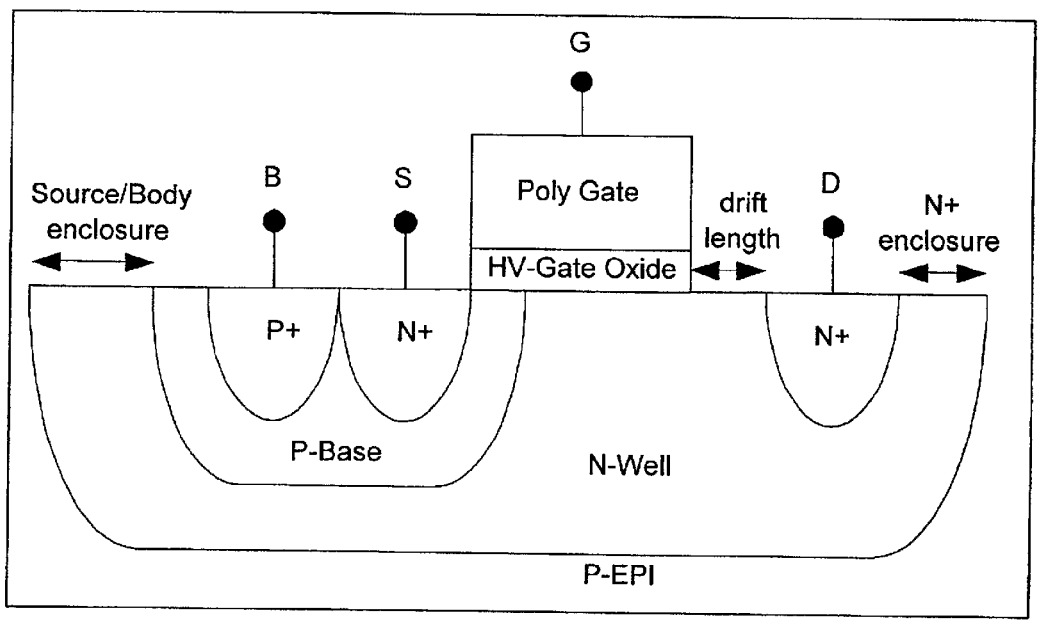
FIG. 27b illustrates a mid-voltage floating source N-LDMOSFET with high voltage gate oxide.

FIG. 15 describes a process which integrates over the basic CMOS process of FIG. 1 a High-voltage mask (Mask 4: High-voltage Gate Oxide) and a P-Base mask (Mask 7: P-Base) so as to produce a Dual gate oxide P-Base fourteen-mask Bipolar/CMOS/DMOS process. As shown in FIG. 2 and FIG. 10, this Dual gate oxide P-Base fourteen-mask Bipolar/CMOS/DMOS process allows the integration of the other six other components of the P-Base thirteen-mask Bipolar/CMOS/DMOS process with standard gate oxide, of another standard Junction isolated N-MOSFET with high-voltage gate oxide, of another mid-voltage single extended P-MOSFET with high-voltage gate oxide, of another mid-voltage double extended P-MOSFET with high-voltage gate oxide, of another mid-voltage single extended N-LDMOSFET with high-voltage gate oxide and of another mid-voltage floating source N-LDMOSFET with high-voltage gate oxide over the ten active components of the Dual gate oxide basic thirteen-mask CMOS process so as to provide the integration of the following twenty-one (21) active components, namely a standard N-MOSFET with standard gate oxide as shown in FIG. 19a; a standard N-MOSFET with high-voltage gate oxide as shown in FIG. 19b; a standard P-MOSFET with standard gate oxide as shown in FIG. 20a; a standard P-MOSFET with high-voltage gate oxide as shown in FIG. 20b; a standard Junction isolated N-MOSFET with standard gate oxide as shown in FIG. 21a; a standard Junction isolated N-MOSFET with high-voltage gate oxide as shown in FIG. 21b; a mid-voltage single extended P-MOSFET with standard gate oxide as shown in FIG. 23a; a mid-voltage single extended P-MOSFET with high-voltage gate oxide as shown in FIG. 23b; a mid-voltage double extended P-MOSFET with standard gate oxide as shown in FIG. 25a; a mid-voltage double extended P-MOSFET with high-voltage gate oxide as shown in FIG. 25b; a mid-voltage single extended N-LDMOSFET with standard gate oxide as shown in FIG. 26a; a mid-voltage single extended N-LDMOSFET with high-voltage gate oxide as shown in FIG. 26b; a mid-voltage floating source N-LDMOSFET with standard gate oxide as shown in FIG. 27a; a mid-voltage floating source N-LDMOSFET with high-voltage gate oxide as shown in FIG. 27b; a high-voltage single extended N-MOSFET with standard gate oxide as shown in FIG. 28a; a high-voltage single extended N-MOSFET with high-voltage gate oxide as shown in FIG. 28b; a high-voltage double extended N-MOSFET with standard gate oxide as shown in FIG. 30a; a high-voltage double extended N-MOSFET with high-voltage gate oxide as shown in FIG. 30b; a lateral NPN bipolar transistor as shown in FIG. 36; a high-voltage vertical NPN bipolar transistor as shown in FIG. 37; and a high-voltage vertical PNP bipolar transistor as shown in FIG. 38.

FIG. 16 describes an important process which integrates over the basic CMOS process of FIG. 1 a High-voltage mask (Mask 4: High-voltage Gate Oxide), a P-Base mask (Mask 7: P-Base) and a N-Extended mask (Mask 8: N-Extended) so as to produce a Dual gate oxide P-Base and N-Extended fifteen-mask Bipolar/CMOS/DMOS process. As shown in FIG. 2 and FIG. 10, this Dual gate oxide P-Base and N-Extended fifteen-mask Bipolar/CMOS/DMOS process allows the integration of the other eleven active components of the Dual gate oxide P-Base fourteen-mask Bipolar/CMOS/DMOS process and of the other four active components of the Dual gate oxide N-Extended fourteen-mask CMOS process over the ten active components of the Dual gate oxide basic thirteen-mask CMOS process as to provide the integration of twenty-five active components, namely a standard N-MOSFET with standard gate oxide as shown in FIG. 19a; a standard N-MOSFET with high-voltage gate oxide as shown in FIG. 19b; a standard P-MOSFET with standard gate oxide as shown in FIG. 20a; a standard P-MOSFET with high-voltage gate oxide as shown in FIG. 20b; a standard Junction isolated N-MOSFET with standard gate oxide as shown in FIG. 21a; a standard Junction isolated N-MOSFET with high-voltage gate oxide as shown in FIG. 21b; a mid-voltage single extended N-MOSFET with standard gate oxide as shown in FIG. 22a; a mid-voltage single extended N-MOSFET with high-voltage gate oxide as shown in FIG. 22b; a mid-voltage single extended P-MOSFET with standard gate oxide as shown in FIG. 23a; a mid-voltage single extended P-MOSFET with high-voltage gate oxide as shown in FIG. 23b; a mid-voltage double extended N-MOSFET with standard gate oxide as shown in FIG. 24a; a mid-voltage double extended N-MOSFET with high-voltage gate oxide as shown in FIG. 24b; a mid-voltage double extended P-MOSFET with standard gate oxide as shown in FIG. 25a; a mid-voltage double extended P-MOSFET with high-voltage gate oxide as shown in FIG. 25b; a mid-voltage single extended N-LDMOSFET with standard gate oxide; as shown in FIG. 26a; a mid-voltage single extended N-LDMOSFET with high-voltage gate oxide as shown in FIG. 26b; a mid-voltage floating source N-LDMOSFET with standard gate oxide as shown in FIG. 27a; a mid-voltage floating source N-LDMOSFET with high-voltage gate oxide as shown in FIG. 27b; a high-voltage single extended N-MOSFET with standard gate oxide as shown in FIG. 28a; a high-voltage single extended N-MOSFET with high-voltage gate oxide as shown in FIG. 28b; a high-voltage double extended N-MOSFET with standard gate oxide as shown in FIG. 30a; a high-voltage double extended N-MOSFET with high-voltage gate oxide as shown in FIG. 30b; a lateral NPN bipolar transistor as shown in FIG. 36; a high-voltage vertical NPN bipolar transistor as shown in FIG. 37; and a high-voltage vertical PNP bipolar transistor as shown in FIG. 38.

Figure 29B:
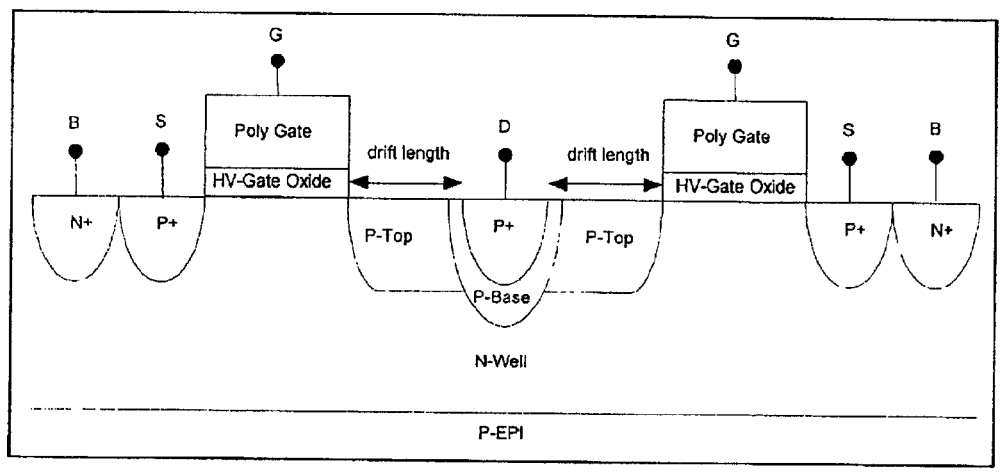
FIG. 29b illustrates a high-voltage single extended P-MOSFET with high-voltage gate oxide.
Figure 31B:
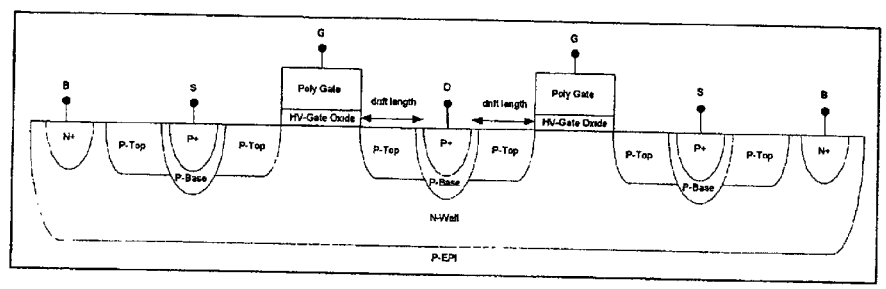
FIG. 31b illustrates a high-voltage double extended P-MOSFET with high-voltage gate oxide.
Figure 32B:
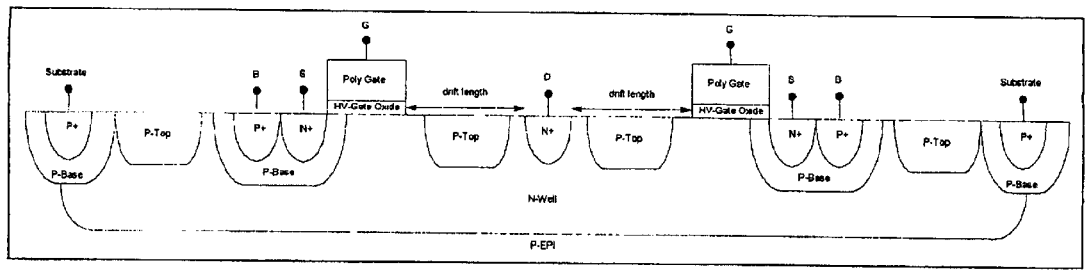
FIG. 32b illustrates a high-voltage double extended N-LDMOSFET with high-voltage gate oxide.
Figure 33B:
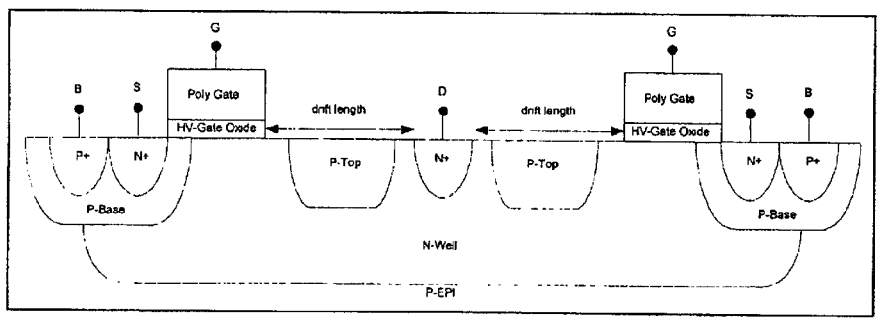
FIG. 33b illustrates a very-high-voltage single extended N-LDMOSFET with high-voltage gate oxide.
Figure 34B:
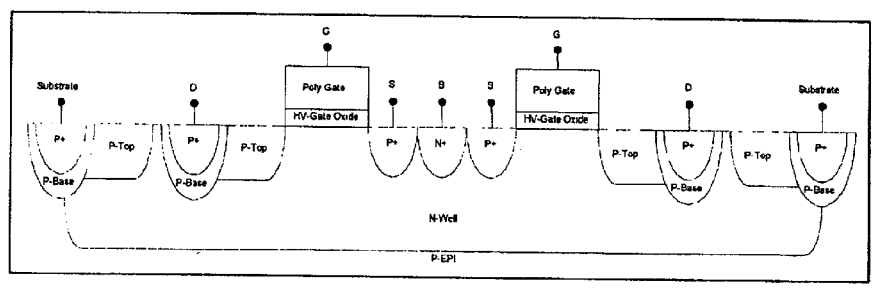
FIG. 34b illustrates a very-high-voltage single extended P-MOSFET with high-voltage gate oxide.
Figure 35B:
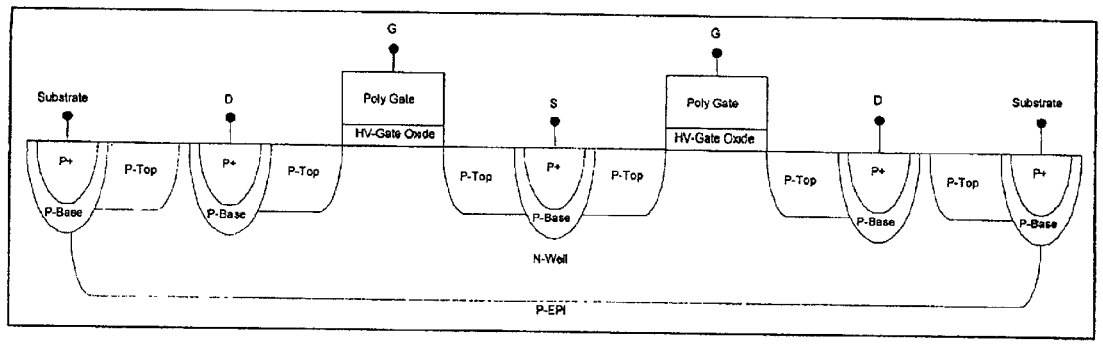
FIG. 35b illustrates a very-high-voltage double extended P-MOSFET with high-voltage gate oxide.
Figure 41B:
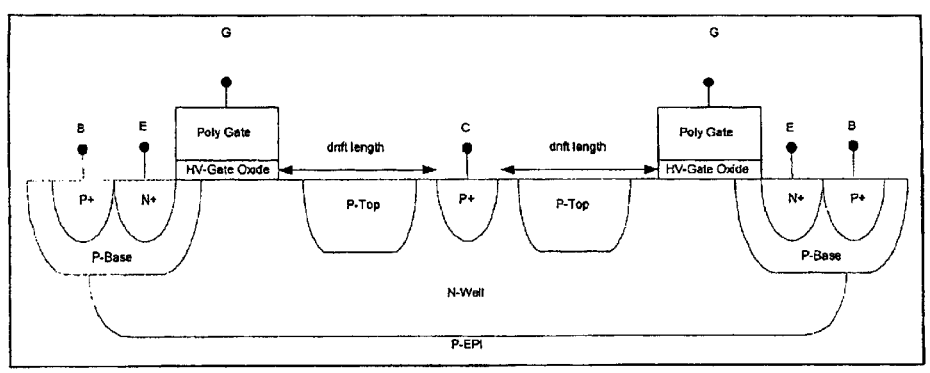
FIG. 41b illustrates a very-high-voltage LIGBT with high-voltage gate oxide.

FIG. 17 describes an important process which integrates over the basic CMOS process of FIG. 1 a High-voltage mask (Mask 4: High-voltage Gate Oxide), a P-Base mask (Mask 7: P-Base) and a P-Top mask (Mask 9: P-Top) so as to produce a Dual gate oxide P-Base and P-Top fifteen-mask Bipolar/CMOS/DMOS process. As shown in FIG. 2 and FIG. 10, this Dual gate oxide P-Base and P-Top fifteen-mask Bipolar/CMOS/DMOS process allows the integration of the other eleven active components of the Dual gate oxide P-Base fourteen-mask Bipolar/CMOS/DMOS process, of the other two active components of the Dual gate oxide P-Top fourteen-mask Bipolar/CMOS process, of the other seven active components of the P-Base and P-Top fourteen-mask Bipolar/CMOS/DMOS process with standard gate oxide, of another high-voltage single extended P-MOSFET with high-voltage gate oxide, of another high-voltage double extended P-MOSFET with high-voltage gate oxide, of another high-voltage double extended N-LDMOSFET with high-voltage gate oxide, of another very-high-voltage single extended N-LDMOSFET with high-voltage gate oxide, of another very-high-voltage single extended P-MOSFET with high-voltage gate oxide, of another very-high-voltage double extended P-MOSFET with high-voltage gate oxide and of another very-high-voltage Lateral Insulated Gate Bipolar transistor LIGBT with high-voltage gate oxide over the ten active components of the Dual gate oxide basic thirteen-mask CMOS process so as to provide the integration of the thirty-seven active components, namely a standard N-MOSFET with standard gate oxide as shown in FIG. 19a; a standard N-MOSFET with high-voltage gate oxide as shown in FIG. 19b; a standard P-MOSFET with standard gate oxide as shown in FIG. 20a; a standard P-MOSFET with high-voltage gate oxide as shown in FIG. 20b; a standard Junction isolated N-MOSFET with standard gate oxide as shown in FIG. 21aa standard Junction isolated N-MOSFET with high-voltage gate oxide as shown in; FIG. 21b; a mid-voltage single extended P-MOSFET with standard gate oxide as shown in FIG. 23a; a mid-voltage single extended P-MOSFET with high-voltage gate oxide as shown in FIG. 23b; a mid-voltage double extended P-MOSFET with standard gate oxide as shown in FIG. 25a; a mid-voltage double extended P-MOSFET with high-voltage gate oxide as shown in FIG. 25b; a mid-voltage single extended N-LDMOSFET with standard gate oxide as shown in FIG. 26a; a mid-voltage single extended N-LDMOSFET with high-voltage gate oxide as shown in FIG. 26b; a mid-voltage floating source N-LDMOSFET with standard gate oxide as shown in FIG. 27a; a mid-voltage floating source N-LDMOSFET with high-voltage gate oxide as shown in FIG. 27b; a high-voltage single extended N-MOSFET with standard gate oxide as shown in FIG. 28a; a high-voltage single extended N-MOSFET with high-voltage gate oxide as shown in FIG. 28b; a high-voltage single extended P-MOSFET with standard gate oxide as shown in FIG. 29a; a high-voltage single extended P-MOSFET with high-voltage gate oxide as shown in FIG. 29b; a high-voltage double extended N-MOSFET with standard gate oxide as shown in FIG. 30a; a high-voltage double extended N-MOSFET with high-voltage gate oxide as shown in FIG. 30b; a high-voltage double extended P-MOSFET with standard gate oxide as shown in FIG. 31a; a high-voltage double extended P-MOSFET with high-voltage gate oxide as shown in FIG. 31b; a high-voltage double extended N-LDMOSFET with standard gate oxide as shown in FIG. 32a; a high-voltage double extended N-LDMOSFET with high-voltage gate oxide as shown in FIG. 32b; a very-high-voltage single extended N-LDMOSFET with standard gate oxide as shown in FIG. 33a; a very-high-voltage single extended N-LDMOSFET with high-voltage gate oxide as shown in FIG. 33b; a very-high-voltage single extended P-MOSFET with standard gate oxide as shown in FIG. 34a; a very-high-voltage single extended P-MOSFET with high-voltage gate oxide as shown in FIG. 34b; a very-high-voltage double extended P-MOSFET with standard gate oxide as shown in FIG. 35a; a very-high-voltage double extended P-MOSFET with high-voltage gate oxide as shown in FIG. 35b; a lateral NPN bipolar transistor as shown in FIG. 36; a high-voltage vertical NPN bipolar transistor as shown in FIG. 37; a high-voltage vertical PNP bipolar transistor as shown in FIG. 38; a very-high-gain vertical NPN bipolar transistor as shown in FIG. 39; a high-voltage N-JFET as shown in FIG. 40; a very-high-voltage Lateral Insulated Gate Bipolar transistor LIGBT with standard gate oxide as shown in FIG. 41a; and a very-high-voltage Lateral Insulated Gate Bipolar transistor LIGBT with high-voltage gate oxide as shown in FIG. 41b.

FIG. 18 describes an important process which integrates over the basic CMOS process of FIG. 1 a High-voltage mask (Mask 4: High-voltage Gate Oxide), a P-Base mask (Mask 7: P-Base), a N-Extended mask (Mask 8: N-Extended) and a P-Top mask (Mask 9: P-Top) as to produce a Dual gate oxide P-Base, N-Extended and P-Top sixteen-mask Bipolar/CMOS/DMOS process. As shown in FIG. 2 and FIG. 10, this Dual gate oxide P-Base, N-Extended and P-Top sixteen-mask Bipolar/CMOS/DMOS process allows the integration of the other twenty-seven active components of the Dual gate oxide P-Base and P-Top fifteen-mask Bipolar/CMOS/DMOS process, of the other two active components of the N-Extended thirteen-mask CMOS process with standard gate oxide, of another mid-voltage single extended N-MOSFET with high-voltage gate oxide and of another mid-voltage double extended N-MOSFET with high-voltage gate oxide over the ten active components of the Dual gate oxide basic thirteen-mask CMOS process so as to provide the integration of the forty-one active components, namely a standard N-MOSFET with standard gate oxide as shown in FIG. 19a; a standard N-MOSFET with high-voltage gate oxide as shown in FIG. 19b; a standard P-MOSFET with standard gate oxide as shown in FIG. 20a; a standard P-MOSFET with high-voltage gate oxide as shown in FIG. 20b; a standard Junction isolated N-MOSFET with standard gate oxide as shown in FIG. 21a; a standard Junction isolated N-MOSFET with high-voltage gate oxide as shown in FIG. 21b; a mid-voltage single extended N-MOSFET with standard gate oxide as shown in FIG. 22a; a mid-voltage single extended N-MOSFET with high-voltage gate oxide as shown in FIG. 22b; a mid-voltage single extended P-MOSFET with standard gate oxide as shown in FIG. 23a; a mid-voltage single extended P-MOSFET with high-voltage gate oxide as shown in FIG. 23b; a mid-voltage double extended N-MOSFET with standard gate oxide as shown in FIG. 24a; a mid-voltage double extended N-MOSFET with high-voltage gate oxide as shown in FIG. 24b; a mid-voltage double extended P-MOSFET with standard gate oxide as shown in FIG. 25a; a mid-voltage double extended P-MOSFET with high-voltage gate oxide as shown in FIG. 25b; a mid-voltage single extended N-LDMOSFET with standard gate oxide as shown in FIG. 26a; a mid-voltage single extended N-LDMOSFET with high-voltage gate oxide as shown in FIG. 26b; a mid-voltage floating source N-LDMOSFET with standard gate oxide as shown in FIG. 27a; a mid-voltage floating source N-LDMOSFET with high-voltage gate oxide as shown in FIG. 27b; a high-voltage single extended N-MOSFET with standard gate oxide as shown in FIG. 28a; a high-voltage single extended N-MOSFET with high-voltage gate oxide as shown in FIG. 28b; a high-voltage single extended P-MOSFET with standard gate oxide as shown in FIG. 29a; a high-voltage single extended P-MOSFET with high-voltage gate oxide as shown in FIG. 29b; a high-voltage double extended N-MOSFET with standard gate oxide as shown in FIG. 30a; a high-voltage double extended N-MOSFET with high-voltage gate oxide as shown in FIG. 30b; a high-voltage double extended P-MOSFET with standard gate oxide as shown in FIG. 31a; a high-voltage double extended P-MOSFET with high-voltage gate oxide as shown in FIG. 31b; a high-voltage double extended N-LDMOSFET with standard gate oxide as shown in FIG. 32a; a high-voltage double extended N-LDMOSFET with high-voltage gate oxide as shown in FIG. 32b; a very-high-voltage single extended N-LDMOSFET with standard gate oxide as shown in FIG. 33a; a very-high-voltage single extended N-LDMOSFET with high-voltage gate oxide as shown in FIG. 33b; a very-high-voltage single extended P-MOSFET with standard gate oxide as shown in FIG. 34a; a very-high-voltage single extended P-MOSFET with high-voltage gate oxide as shown in FIG. 34b; a very-high-voltage double extended P-MOSFET with standard gate oxide as shown in FIG. 35a; a very-high-voltage double extended P-MOSFET with high-voltage gate oxide as shown in FIG. 35b; a lateral NPN bipolar transistor as shown in FIG. 36; a high-voltage vertical NPN bipolar transistor as shown in FIG. 37; a high-voltage vertical PNP bipolar transistor as shown in FIG. 38; a very-high-gain vertical NPN bipolar transistor as shown in FIG. 39; a high-voltage N-JFET as shown in FIG. 40; a very-high-voltage Lateral Insulated Gate Bipolar transistor LIGBT with standard gate oxide as shown in FIG. 41a; and a very-high-voltage Lateral Insulated Gate Bipolar transistor LIGBT with high-voltage gate oxide as shown in FIG. 41b.

It is clear from FIG. 9 that the P-Base, N-Extended and P-Top Bipolar/CMOS/DMOS process with standard gate oxide is an extremely flexible process since the combinations of P-Base, N-Extended and P-Top masks allow the designer to combine the twenty-three different active components into an integrated circuit without having to deal with multiple circuits or with complex processes, namely a standard N-MOSFET with standard gate oxide as shown in FIG. 19a; a standard P-MOSFET with standard gate oxide as shown in FIG. 20a; a standard Junction isolated N-MOSFET with standard gate oxide as shown in FIG. 21a; a mid-voltage single extended N-MOSFET with standard gate oxide as shown in FIG. 22a; a mid-voltage single extended P-MOSFET with standard gate oxide as shown in FIG. 23a; a mid-voltage double extended N-MOSFET with standard gate oxide as shown in FIG. 24a; a mid-voltage double extended P-MOSFET with standard gate oxide as shown in FIG. 25a; a mid-voltage single extended N-LDMOSFET with standard gate oxide as shown in FIG. 26a; a mid-voltage floating source N-LDMOSFET with standard gate oxide as shown in FIG. 27aa high-voltage single extended N-MOSFET with standard gate oxide as shown in; FIG. 28a; a high-voltage single extended P-MOSFET with standard gate oxide as shown in FIG. 29a; a high-voltage double extended N-MOSFET with standard gate oxide as shown in FIG. 30a; a high-voltage double extended P-MOSFET with standard gate oxide as shown in FIG. 31a; a high-voltage double extended N-LDMOSFET with standard gate oxide as shown in FIG. 32a; a very high-voltage single extended N-LDMOSFET with standard gate oxide as shown in FIG. 33a; a very-high-voltage single extended P-MOSFET with standard gate oxide as shown in FIG. 34a; a very-high-voltage double extended P-MOSFET with standard gate oxide as shown in FIG. 35a; a lateral NPN bipolar transistor as shown in FIG. 36; a high-voltage vertical NPN bipolar transistor as shown in FIG. 37; a high-voltage vertical PNP bipolar transistor as shown in FIG. 38; a very-high-gain vertical NPN bipolar transistor as shown in FIG. 39; a high-voltage N-JFET as shown in FIG. 40; and a very-high-voltage Lateral Insulated Gate Bipolar transistor LIGBT with standard gate oxide as shown in FIG. 41a.

It is clear from FIG. 42 and FIG. 43 that these twenty-three different active components are associated with very different operating voltage characteristics. They are also associated with a wide variety of other electrical performances such as breakdown voltage, cut-off frequency, specific channel resistance, size figure-of-merit, which allows the designer to cherry-pick the ideal combination of active components for a given application and to cherry-pick another different combination of active components for another application.

Again, this invention provides an extremely versatile set of active components for the designer which allow the integration of components which would otherwise be achieved using independent substrates and/or much more complex processes.

It is clear from FIG. 18 that the Dual gate oxide P-Base, N-Extended and P-Top Bipolar/CMOS/DMOS process is an extremely flexible process since the combinations of P-Base, N-Extended and P-Top masks allow the designer to combine the forty-one different active components into an integrated circuit without having to deal with multiple circuits or with much more complex processes, namely a standard N-MOSFET with standard gate oxide as shown in FIG. 19a; a standard N-MOSFET with high-voltage gate oxide as shown in FIG. 19b; a standard P-MOSFET with standard gate oxide as shown in FIG. 20a; a standard P-MOSFET with high-voltage gate oxide as shown in FIG. 20b; a standard Junction isolated N-MOSFET with standard gate oxide as shown in FIG. 21a; a standard Junction isolated N-MOSFET with high-voltage gate oxide as shown in FIG. 21b; a mid-voltage single extended N-MOSFET with standard gate oxide as shown in FIG. 22a; a mid-voltage single extended N-MOSFET with high-voltage gate oxide as shown in FIG. 22b; a mid-voltage single extended P-MOSFET with standard gate oxide as shown in FIG. 23a; a mid-voltage single extended P-MOSFET with high-voltage gate oxide as shown in FIG. 23b; a mid-voltage double extended N-MOSFET with standard gate oxide as shown in FIG. 24a; a mid-voltage double extended N-MOSFET with high-voltage gate oxide as shown in FIG. 24b; a mid-voltage double extended P-MOSFET with standard gate oxide as shown in FIG. 25a; a mid-voltage double extended P-MOSFET with high-voltage gate oxide as shown in FIG. 25b; a mid-voltage single extended N-LDMOSFET with standard gate oxide as shown in FIG. 26a; a mid-voltage single extended N-LDMOSFET with high-voltage gate oxide as shown in FIG. 26b; a mid-voltage floating source N-LDMOSFET with standard gate oxide as shown in FIG. 27a; a mid-voltage floating source N-LDMOSFET with high-voltage gate oxide; as shown in FIG. 27b; a high-voltage single extended N-MOSFET with standard gate oxide as shown in FIG. 28a; a high-voltage single extended N-MOSFET with high-voltage gate oxide as shown in FIG. 28b; a high-voltage single extended P-MOSFET with standard gate oxide as shown in FIG. 29a; a high-voltage single extended P-MOSFET with high-voltage gate oxide as shown in FIG. 29b; a high-voltage double extended N-MOSFET with standard gate oxide as shown in FIG. 30a; a high-voltage double extended N-MOSFET with high-voltage gate oxide as shown in FIG. 30b; a high-voltage double extended P-MOSFET with standard gate oxide as shown in FIG. 31a; a high-voltage double extended P-MOSFET with high-voltage gate oxide as shown in FIG. 31b; a high-voltage double extended N-LDMOSFET with standard gate oxide as shown in FIG. 32a; a high-voltage double extended N-LDMOSFET with high-voltage gate oxide as shown in FIG. 32b; a very-high-voltage single extended N-LDMOSFET with standard gate oxide as shown in FIG. 33a; a very-high-voltage single extended N-LDMOSFET with high-voltage gate oxide as shown in FIG. 33b; a very-high-voltage single extended P-MOSFET with standard gate oxide as shown in FIG. 34a; a very-high-voltage single extended P-MOSFET with high-voltage gate oxide as shown in FIG. 34b; a very-high-voltage double extended P-MOSFET with standard gate oxide as shown in FIG. 35a; a very-high-voltage double extended P-MOSFET with high-voltage gate oxide as shown in FIG. 35b; a lateral NPN bipolar transistor as shown in FIG. 36a high-voltage vertical NPN bipolar transistor as shown in; FIG. 37; a high-voltage vertical PNP bipolar transistor as shown in FIG. 38; a very-high-gain vertical NPN bipolar transistor as shown in FIG. 39; a high-voltage N-JFET as shown in FIG. 40; a very-high-voltage Lateral Insulated Gate Bipolar transistor LIGBT with standard gate oxide as shown in FIG. 41a; and a very-high-voltage Lateral Insulated Gate Bipolar transistor LIGBT with high-voltage gate oxide as shown in FIG. 41b.

Again, it is clear from FIG. 42 and FIG. 43 that these forty-one different active components are associated with very different operating voltage characteristics. They are also associated with a wide variety of other electrical performances such as breakdown voltage, cut-off frequency, specific channel resistance, size figure-of-merit, which allows the designer to cherry-pick the ideal combination of active components for a given application and to cherry-pick another different combination of active components for another application using this unique process.

The novel process provides an extremely versatile set of active components for the designer which allow the integration of components which would otherwise be achieved using independent substrates and/or much more complex processes.

The invention can be practiced on a Silicon Over Isolator (SOI) substrate and achieve higher breakdown voltage up to about 1200 volts for the following active components if the silicon layer over the buried oxide is thicker then 1.5 µm: a high-voltage double extended N-LDMOSFET shown in FIG. 32a; a high-voltage double extended N- LDMOSFET shown in FIG. 32b; a very-high-voltage single extended N-LDMOSFET shown in FIG. 33a; a very-high-voltage single extended N-LDMOSFET shown in FIG. 33b; a very-high-voltage single extended P-MOSFET shown in FIG. 34a; a very-high-voltage single extended P-MOSFET shown in FIG. 34b; a very-high-voltage double extended P-MOSFET shown in FIG. 35a; a very-high-voltage double extended P-MOSFET shown in FIG. 35b; and a high-voltage N-JFET shown in FIG. 40.

Similarly, the maximum operating drain voltage of the following active components could be increased to 1200 volts if the resistivity of the various layers is optimized: the high-voltage double extended N-LDMOSFET of FIG. 32a; the high-voltage double extended N-LDMOSFET of FIG. 32b; the very-high-voltage single extended N-LDMOSFET of FIG. 33a; the very-high-voltage single extended N-LDMOSFET of FIG. 33b; the very-high-voltage single extended P-MOSFET of FIG. 34a; the very-high-voltage single extended P-MOSFET of FIG. 34b; the very-high-voltage double extended P-MOSFET of FIG. 35a; and the very-high-voltage double extended P-MOSFET of FIG. 35b; the high-voltage N-JFET of FIG. 40;

The lower voltage range of 3.3 volts of the following active components could be reduced down to 2.5 volts if the speed reduction associated with the gate operation voltage of 2.5 volts is high enough for the application: the standard N-MOSFETs of FIG. 19a; the standard N-MOSFETs of FIG. 19b; the standard P-MOSFETs of FIG. 20a; the standard P-MOSFETs of FIG. 20b; the standard Junction isolated N-MOSFETs of FIG. 21a; and the standard Junction isolated N-MOSFETs of FIG. 21b.

The invention finds application in analog devices and/or integrated circuit requiring a mix of transistors characteristics and/or operation voltages; mixed-signal devices and/or integrated circuit requiring a mix of transistors characteristics and/or operation voltages; Bipolar devices and/or integrated circuit requiring a mix of transistors characteristics and/or operation voltages; CMOS devices and/or integrated circuit requiring a mix of transistors characteristics and/or operation voltages; DMOS devices and/or integrated circuit requiring a mix of transistors characteristics and/or operation voltages; Bi-CMOS devices and/or integrated circuit requiring a mix of transistors characteristics and/or operation voltages; Micro-Electro-Mechanical Systems (MEMS) requiring a mix of transistors characteristics and/or operation voltages; Micro-Opto-Electro-Mechanical Systems (MOEMS) requiring a mix of transistors characteristics and/or operation voltages; biological or medical devices and/or circuits such as biochips, laboratory-on-a-chip (LOAC) or micro-total analysis systems (µ-TAS) requiring a mix of transistors characteristics and/or operation voltages; charged Coupled Devices (CCD) devices and/or circuits requiring a mix of transistors characteristics and/or operation voltages; and CCD/CMOS devices and/or circuits requiring a mix of transistors characteristics and/or operation voltages. This is not an exhaustive list. Other applications will be apparent to one skilled in the art.

The embodiments presented are exemplary only and persons skilled in the art would appreciate that variations to the above described embodiments may be made without departing from the spirit of the invention. The scope of the invention is solely defined by the appended claims.

We claim:

1. A manufacturing process for making various high-voltage bipolar/CMOS/DMOS (BCD) integrated circuits of different type using a limited number of different mask steps, said process comprising:

(a) predefining a set of mask steps, each mask step comprising performing an associated activity through a separate mask distinct from the respective masks associated with the other mask steps of said set of mask steps;

(b) identifying a plurality of specific sequences of mask steps from said predefined set, each specific sequence being associated with the manufacture of one or more specific integrated circuits;

(c) selecting a specific integrated circuit to manufacture;

(d) selecting one of said specific sequences of mask steps from said predefined set of mask steps as a selected specific sequence to manufacture said specific integrated circuit;

(e) providing a starting material selected from the group consisting of: a p-type bulk substrate, and a p-type epitaxial layer over a $P^+$ bulk subtrate; and (f) performing said selected sequence of mask steps on said starting material in numerical order to make said selected specific integrated circuit; and said predefined set of mask steps consisting essentially of:

(1) a first mask step wherein an n-type implant is performed in said p-type material to form an N-well with the aid of a mask identified as an N-well mask;

(2) a second mask step wherein an active region is formed by etching through an oxidation layer with the aid of a mask identified as an active region mask;

(3) a third mask step wherein a p-type field region is formed by performing a p-type implant with the aid of a mask identified as a P-field mask;

(4) a fourth mask step wherein a gate oxide is etched with the aid of a mask identified as a gate oxide mask;

(5) a fifth mask step wherein a p-type implantation is carried out with the aid of a mask identified as a thin gate oxide mask;

(6) a sixth mask step wherein polysilicon gate regions are etched with the aid of a mask identified as a polysilicon gate patterning mask;

(7) a seventh mask step wherein a p-base region is formed by p-type implantation with the aid of a mask identified as a p-base mask;

(8) an eighth mask step wherein a N-extended region is formed by N-type implantation with the aid of a mask identified as an N-extended region mask;

(9) a ninth mask step wherein a p-top region is formed by p-type implantation with the aid of a mask identified as a P-top mask;

(10) a tenth mask step wherein an N+ implantation is carried out with the aid of a mask identified as an $N^+$ implant mask;

(11) an eleventh mask step wherein a $P^+$ implantation is carried out with the aid of mask identified as a $P^+$ implant mask;

(12) a twelfth mask step wherein contacts are etched with the aid of a mask identified as a contact mask;

(13) a thirteenth mask step wherein a deposited first metal layer is etched with the aid of a mask identified as a first metal mask;

(14) a fourteenth mask step wherein vias are etched in underlying material with the aid of a mask identified as a vias mask;

(15) a fifteenth mask step wherein a deposited second metal layer is etched with the aid of a mask identified as a second metal mask; and

(16) a sixteenth mask step wherein passivation layer is etched with the aid of a mask identified as a passivation mask; and wherein said selected specific sequence consists of at least said mask steps 1 to 3, 5, 6, 8 and 10 to 16 and at least one of said mask steps 4, 7, and 9 depending on the type of said selected specific integrated circuit.

2. The process as claimed in claim 1, wherein said selected sequence comprises mask steps 1, 2, 3, 5, 6, 8, 9, 10, 11, 12, 13, 14, 15, and 16.

3. The process as claimed in claim 1, wherein said selected specific sequence comprises mask steps 1, 2, 3, 4, 5, 6, 7, 8, 9, 10, 11, 12, 13, 14, 15, and 16.

4. The process as claimed in claim 1, wherein said selected specific sequence comprises mask steps 1, 2, 3, 4, 5, 6, 7, 8, 9, 10, 11, 12, 13, 14, 15, and 16.

5. The process as claimed in claim 1, wherein said selected specific sequence comprises mask step 1, 2, 3, 4, 5, 6, 8, 9, 10, 11, 12, 13, 14, 15, and 16.

6. The process as claimed in claim 1, wherein said selected specific sequence comprises mask step 1, 2, 3, 4, 5, 6, 8, 9, 10, 11, 12, 13, 14, 15, and 16.

7. The process as claimed in claim 1, wherein said selected specific sequence comprises mask steps 1, 2, 3, 4, 5, 6, 7, 8, 9, 10, 11, 12, 13, 14, 15, and 16.

8. The process as claimed in claim 1, wherein said selected specific sequence comprises mask steps 1, 2, 3, 4, 5, 6, 7, 8, 9, 10, 11, 12, 13, 14, 15, and 16.

9. The process as claimed in claim 1, wherein:
a) mask step 1 comprises the sub-steps of:
   (i) using P− bulk Silicon as a starting material;
   (ii) performing an initial oxidation;
   (iii) performing a photolithographic step;
   (iv) performing an N-Type Implant to create said N-Well; and
   (v) performing a diffusion;
b) mask step 2 comprises the sub-steps of:
   (i) performing and oxide etch;
   (ii) performing an oxidation;
   (iii) performing a silicon nitride deposition;
   (iv) performing a photolithographic step; and
   (v) performing a nitride etch;
c) mask step 3 comprises the sub-steps of:
   (i) performing a photolithographie step;
   (ii) performing a P-Type Implant;
   (iii) performing a blanket N-Type Implant;
   (iv) performing an oxidation step to form a field oxide;
   (v) performing a nitride etch;
   (vi) performing an oxide etch; and
   (iv) performing an oxidation to form a pre-gate oxide;
d) mask step 4 comprises the sub-steps of:
   (i) performing an oxide etch;
   (ii) performing an oxidation the gate oxide; and
   (ii) performing a photolithographic step;
e) mask step 5 comprises the sub-steps of:
   (i) performing an oxide etch;
   (ii) performing an oxidation to form said thin gate oxide;
   (iii) performing a photolithographic step;
   (iv) performing a P-Type Implant;
f) mask step 6 comprises the sub-steps of:
   (i) performing polysilicon gate deposition;
   (ii) performing polysilicon doping;
   (iii) performing a photolithographic step;
   (iv) performing a polysilicon etch;
g) mask step 7 comprises the sub-steps of:
   (i) performing a photolithographic step;
   (ii) performing a P-type implant to form the P-base;
h) mask step 8 comprises the sub-steps of:
   (i) performing a photolithographic step;
   (ii) performing an N-type implant;
i) mask step 9 comprises the sub-steps of:
   (i) performing a photolithographic step;
   (ii) performing a P-type implant;
(j) mask step 10 comprises the sub-steps of:
   (i) performing an oxidation and diffusion step;
   (ii) performing a polysilicon oxidation;
   (iii) performing a photolithographic step; and
   (iv) performing an N-type implant to create said N$^+$ implant region;
(k) mask step 11 comprises the sub-steps of:
   (i) performing a photolithographic step; and
   (ii) performing a P-type implant to create said P$^+$ implant region;
(l) mask step 12 comprises the sub-steps of:
   (i) performing a SG/PSG/SOG deposition;
   (ii) performing a diffusion step; and
   (iii) performing a photolithographic step; and
   (iv) performing a contact etch;
(m) mask step 13 comprises the sub-steps of:
   (i) performing a Ti/TiN deposition with oxidation;
   (ii) performing an aluminum alloy deposition;
   (iii) performing a photolithographic step;
   (iv) performing a metal etch; and
   (v) performing dielectric and SOG deposition;
(n) mask step 14 comprises the sub-steps of:
   (i) performing a photolithographic step; and
   (ii) etching said vias; and
(o) mask step 15 comprises the sub-steps of:
   (i) performing Ti/TiN deposition with oxidation;
   (ii) performing an aluminum alloy deposition;
   (iii) performing a photolithographic step;
   (iv) performing a metal etch;
   (v) performing an oxide/nitride deposition;
   (vi) performing a photolithographic step; and
   (vii) pexforming an oxide etch.
   (iv) performing a metal etch;
   (v) performing an oxide/nitride deposition;
   (vi) performing a photolithographic step; and
   (vii) performing an oxide etch.

10. A manufacturing process for making various high-voltage bipolar/CMOS/DMOS (BCD) integrated circuits comprising:
(a) providing a starting material selected from the group consisting of: a p-type bulk substrate, and a p-type epitaxial layer over a P$^+$ bulk substrate; and
(b) performing a sequence of mask steps on said starting material, each mask step comprising performing an associated activity through a separate mask distinct from the respective masks associated with other mask steps of, wherein said sequence of mask steps comprises:
(1) a first mask step wherein an n-type implant is performed in said p-type material to form an N-well with the aid of a mask identified as an N-well mask;

(2) a second mask step wherein an active region is formed by etching through an oxidation layer with the aid of a mask identified as an active region mask;

(3) a third mask step wherein a p-type field region is formed by performing a p-type implant with the aid of a mask identified as a P-field mask;

(4) a fourth mask step wherein a gate oxide is etched with the aid of a mask identified as a gate oxide mask;

(5) a fifth mask step wherein a p-type implantation is carried out with the aid of a mask identified as a thin gate oxide mask;

(6) a sixth mask step wherein gate regions are etched with the aid of a mask identified as a polysilicon gate patterning mask;

(7) a seventh mask step wherein an N+ implantation is carried out with the aid of a mask identified as an N+ implant mask;

(8) an eighth mask step wherein a P+ implantation is carried out with the aid of a mask identified as a P+ implant mask;

(9) a ninth mask step wherein contacts are etched with the aid of a mask identified as a contact mask;

(10) a tenth mask step wherein a deposited first metal layer is etched with the aid of a mask identified as a first metal mask;

(11) an eleventh mask step wherein vias are etched in underlying material with the aid of a mask identified as a vias mask;

(12) a twelfth mask step wherein a deposited second metal layer is etched with the aid of a mask identified as a second metal mask; and

(13) a thirteenth mask step wherein a passivation layer is etched with the aid of a mask identified as a passivation mask.

11. The process of claim 10, further comprising a further distinct and separate intermediate mask step between said sixth and seventh recited mask steps, said further distinct and separate intermediate mask step comprising forming a p-top region by p-type implantation with the aid of a mask identified as a P-top mask.

* * * * *